United States Patent
Min

(10) Patent No.: US 10,164,209 B2
(45) Date of Patent: *Dec. 25, 2018

(54) ELECTRONIC DEVICE AND DISPLAY MODULE PROVIDED THEREIN

(71) Applicant: SAMSUNG DISPLAY CO., LTD., Yongin-si, Gyeonggi-Do (KR)

(72) Inventor: Myoungan Min, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/886,213

(22) Filed: Feb. 1, 2018

(65) Prior Publication Data

US 2018/0159067 A1    Jun. 7, 2018

Related U.S. Application Data

(63) Continuation of application No. 15/379,072, filed on Dec. 14, 2016, now Pat. No. 9,911,942.

(30) Foreign Application Priority Data

May 4, 2016 (KR) .......................... 10-2016-0055744
Aug. 29, 2016 (KR) .......................... 10-2016-0110169

(51) Int. Cl.
  *H05K 5/00* (2006.01)
  *H01L 51/52* (2006.01)
  (Continued)

(52) U.S. Cl.
  CPC ........ *H01L 51/524* (2013.01); *H04M 1/0266* (2013.01); *H05K 999/99* (2013.01);
  (Continued)

(58) Field of Classification Search
  CPC . H01L 51/524; H01L 27/323; H01L 51/5284; H01L 51/5237; H04M 1/0266
  (Continued)

(56) References Cited

U.S. PATENT DOCUMENTS

2009/0049773 A1* 2/2009 Zadesky ........... B32B 17/10018
                                                52/204.62
2009/0174995 A1   7/2009 Prest et al.
                                                (Continued)

FOREIGN PATENT DOCUMENTS

KR    1020110032901    3/2011
KR    1020120131416    12/2012
KR    1020130091588    8/2015

*Primary Examiner* — Sherman Ng
(74) *Attorney, Agent, or Firm* — F. Chau & Associates, LLC

(57) ABSTRACT

An electronic device includes a display module, a bottom cover disposed below the display module, and a top cover disposed above the display module and overlapping at least a portion of the display module. The top cover is coupled to the display module or the bottom cover. The display module includes a display panel, a display window. The display window includes a central portion disposed above the display panel and an edge portion connected to the central portion. The edge portion overlaps the top cover and is thinner than the central portion. The bezel is disposed on a bottom surface of the display window and overlaps the edge portion.

22 Claims, 24 Drawing Sheets

(51) Int. Cl.
  *H04M 1/02* (2006.01)
  *H01L 27/32* (2006.01)
(52) U.S. Cl.
  CPC ........ *H01L 27/323* (2013.01); *H01L 51/5237* (2013.01); *H01L 51/5284* (2013.01)
(58) Field of Classification Search
  USPC ........................................................ 361/752
  See application file for complete search history.

(56) References Cited

U.S. PATENT DOCUMENTS

2009/0290319  A1   11/2009  Myers et al.
2013/0201575  A1    8/2013  Cheon
2017/0324058  A1   11/2017  Min \* cited by examiner

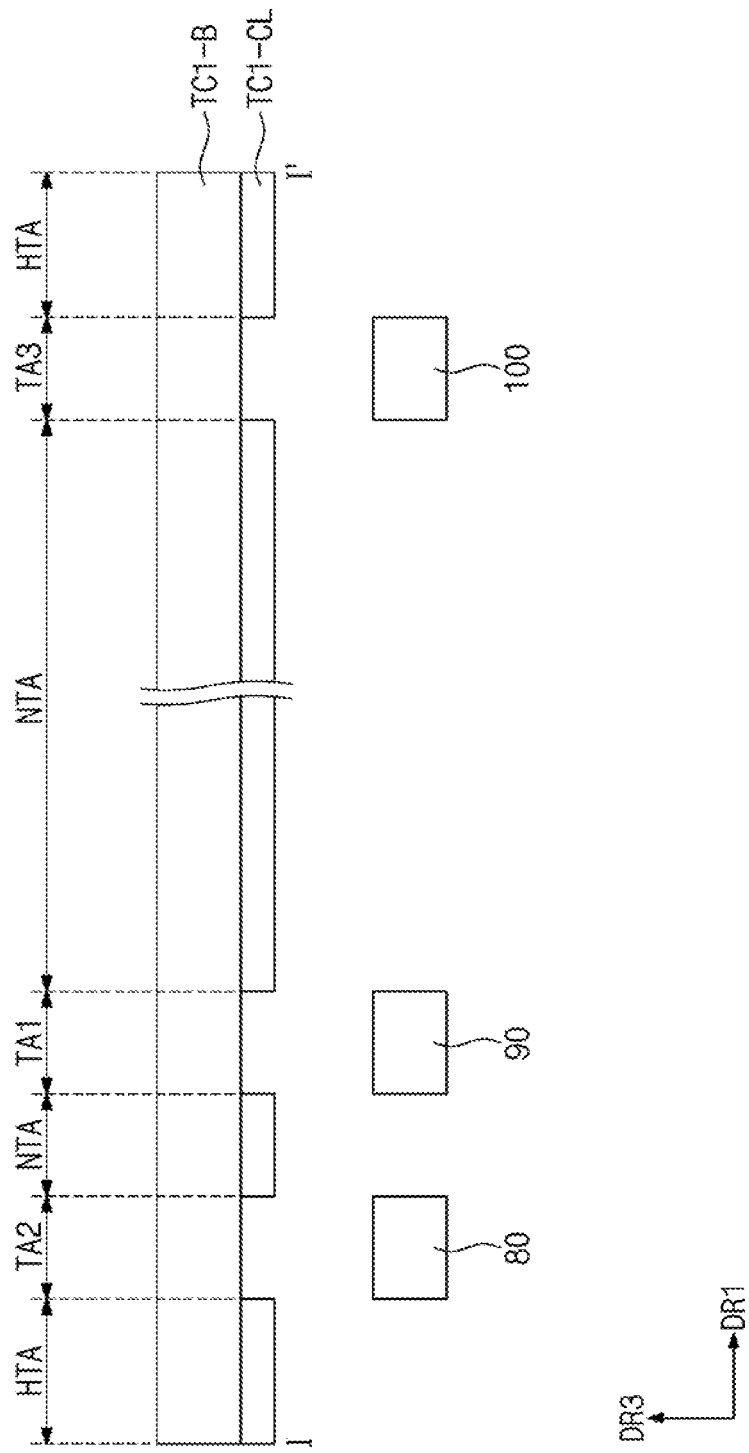

ELECTRONIC DEVICE AND DISPLAY MODULE PROVIDED THEREIN

CROSS-REFERENCE TO RELATED APPLICATIONS

This Application is a Continuation of U.S. patent application Ser. No. 15/379,072, filed on Dec. 14, 2016, which claims priority under 35 U.S.C. § 119 to Korean Patent Application No. 10-2016-0055744, filed on May 4, 2016, and Korean Patent Application No. 10-2016-0110169, filed on Aug. 29, 2016, the entire contents of which are hereby incorporated by reference.

TECHNICAL FIELD

The present disclosure relates to an electronic device, and more particularly, to an electronic device and a display module provided therein.

DISCUSSION OF THE RELATED ART

Electronic devices such as smartphones, tablet computers, notebook computers, and smart televisions have been developed. Each of these electronic devices includes a display module capable of displaying an image.

While electronic devices such as these have often had a predominantly rectangular shape, today electronic devices may have a wider variety of shapes, and accordingly, the display modules included therein have also changed to have a wider variety of shapes.

SUMMARY

An electronic device includes a display module, a bottom cover disposed below the display module, and a top cover disposed above the display module and overlapping at least a portion of the display module. The top cover is coupled to the display module or the bottom cover. The display module includes a display panel, a display window. The display window includes a central portion disposed above the display panel and an edge portion connected to the central portion. The edge portion overlaps the top cover and is thinner than the central portion. The bezel is disposed on a bottom surface of the display window and overlaps the edge portion.

A display module includes a display panel, a display window, and a bezel. The display window includes a central portion and an edge portion connected to the central portion. The edge portion has a thickness less than that of the central portion. The display window is disposed above the display panel. The bezel is disposed on a bottom surface of the display window and overlaps the edge portion.

An electronic device includes a display module, a bottom cover disposed below the display module, and a top cover disposed above the display module and overlapping at least a portion of the display module. The top cover is coupled to the display module or the bottom cover. The display module includes a display panel, a display window and a bezel. The display window includes a central portion disposed above the display panel and an edge portion connected to the central portion. The edge portion overlaps the top cover and is thinner than the central portion. A functional layer is disposed on the central portion of the display window and exposes the edge portion.

An electronic device includes a first housing, a second housing attached to the first housing, a display panel disposed between the first housing and the second housing; a display window disposed between the display panel and the second housing. The display window includes an inner portion and an outer portion framing the inner portion. The second housing overlaps the outer portion of the display window. A thickness of the inner portion of the display window is substantially equal to a thickness of the outer portion of the display window plus the thickness of a portion of the second housing that overlaps the outer portion of the display window.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein:

FIGS. 3B and 3C are cross-sectional views illustrating an electronic device according to an exemplary embodiment of the present inventive concept;

DETAILED DESCRIPTION

Figure 1:
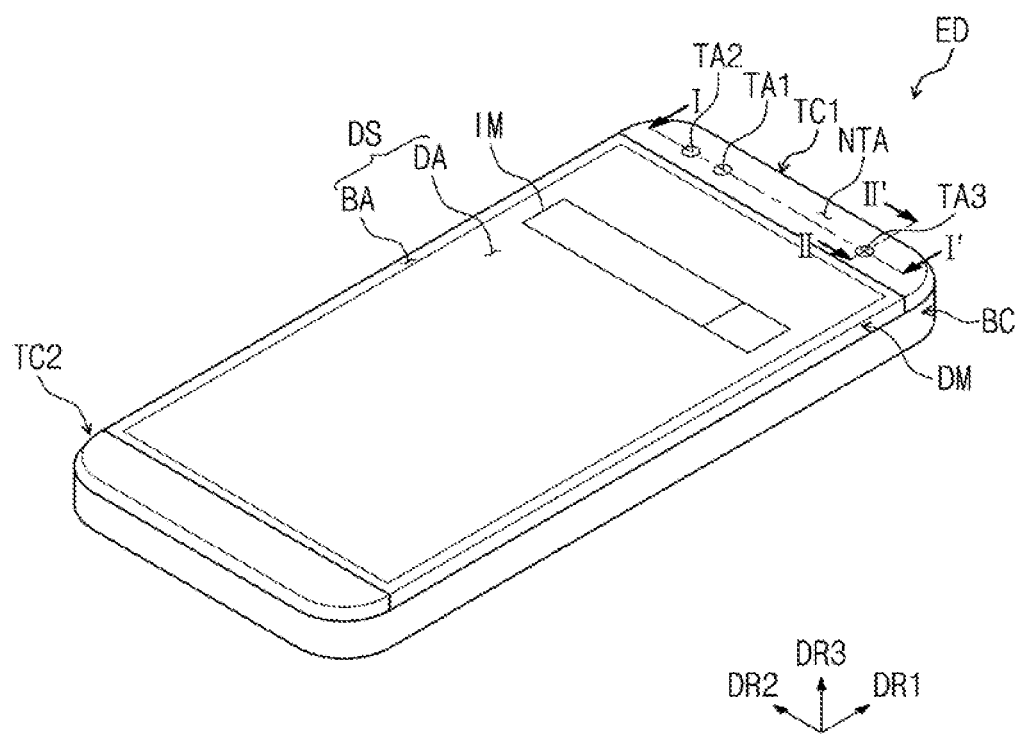
FIG. 1 is a perspective view illustrating an electronic device according to an exemplary embodiment of the present inventive concept.

Hereinafter, exemplary embodiments of the present invention will be described with reference to the accompanying drawings. It will be understood that when an element such as a region, layer, or portion is referred to as being "on", "connected to", or "coupled to" another element, it can be directly on, connected to, or coupled to the another element or intervening elements may also be present.

Like reference numerals may refer to similar or identical elements throughout the specification and drawings. Also, in the drawings, the thicknesses, ratios, and dimensions of components may be exaggerated for effective description of technical contents.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment without departing from the spirit or scope of the invention. The terms of a singular form may include plural forms unless otherwise provided.

Figure 2:
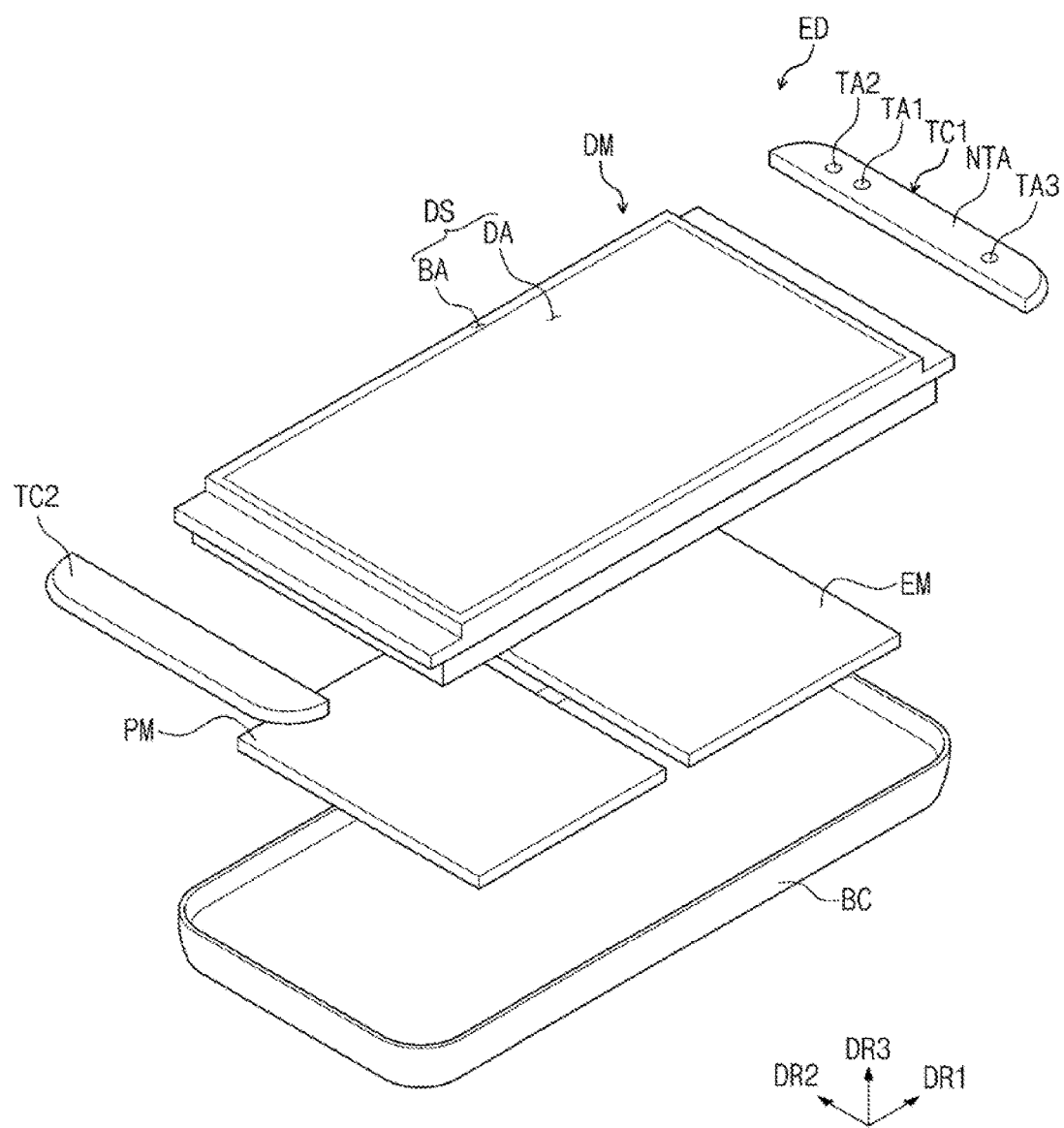
FIG. 2 is an exploded perspective view illustrating an electronic device according to an exemplary embodiment of the present inventive concept.
Figure 3A:
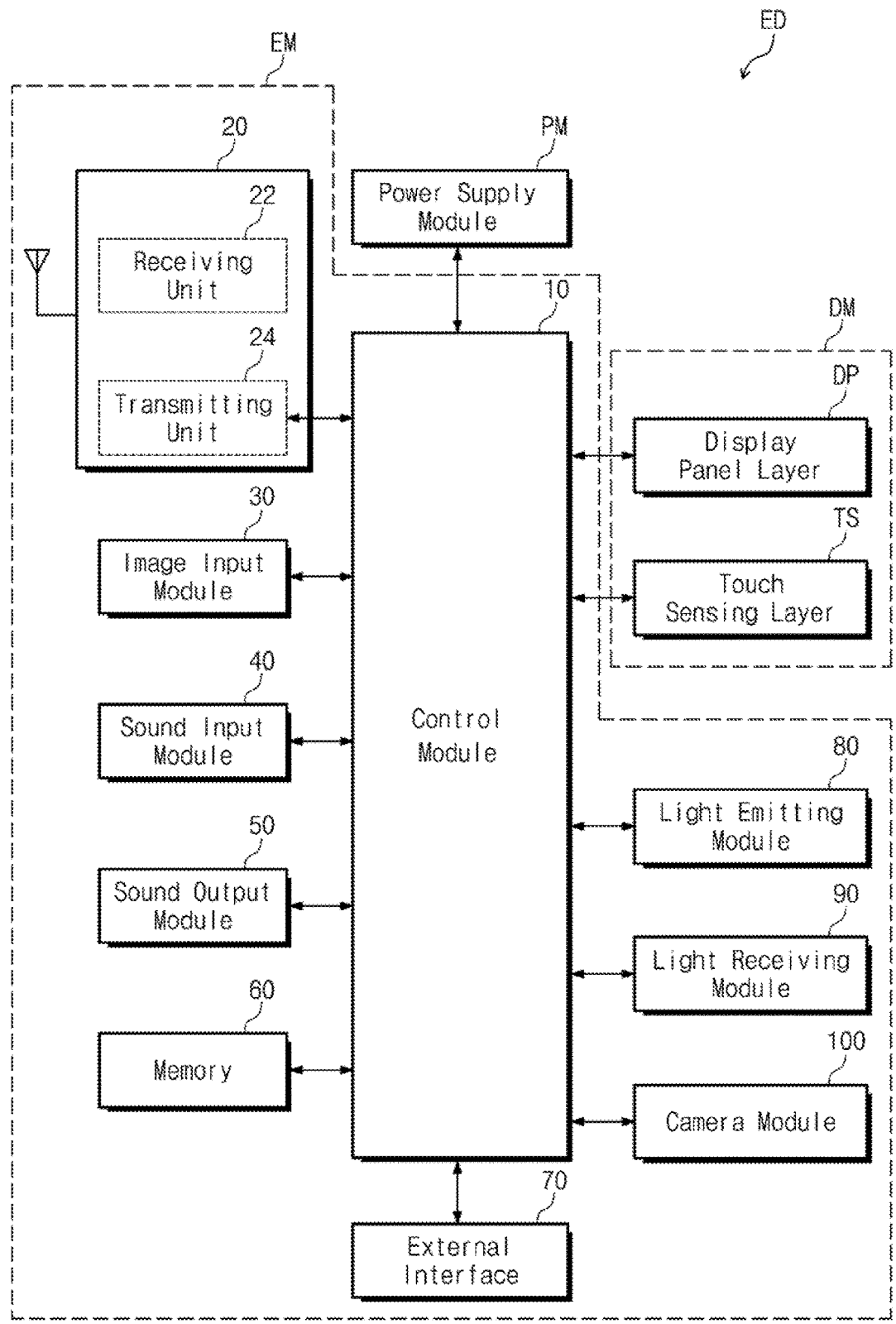
FIG. 3A is a block diagram illustrating am electronic device according to an exemplary embodiment of the present inventive concept.
Figure 3C:
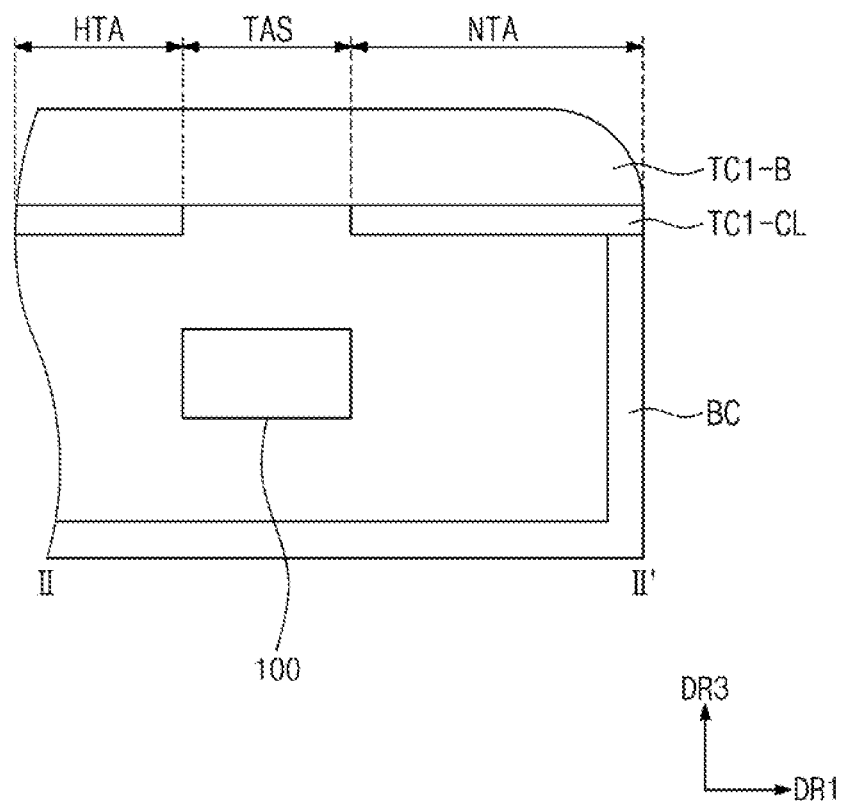

FIG. 1 is a perspective view illustrating an electronic device ED according to an exemplary embodiment of the present inventive concept. FIG. 2 is an exploded perspective view illustrating an electronic device ED according to an exemplary embodiment of the inventive concept. FIG. 3A is a block diagram illustrating an electronic device ED according to an exemplary embodiment of the inventive concept. FIGS. 3B and 3C are cross-sectional views illustrating an electronic device ED according to an exemplary embodiment of the inventive concept.

As illustrated in FIG. 1, a display surface DS on which an image IM is displayed is disposed on a plane defined by a first directional axis DR1 and a second directional axis DR2. The display surface DS includes a display area DA and a bezel area BA disposed adjacent to, and framing, the display area DA. FIG. 1 illustrates an internet search window as an example of the image IM being displayed. As shown, the display area DA may have a rectangular shape. However, the display area may have any desired shape. The bezel area BA surrounds the display area DA. For example, the bezel area BA is disposed at the edges of the display surface DS.

A direction that is normal to the display surface DS, e.g., a thickness direction of the electronic device ED, may be referred to herein as a third directional axis DR3. With reference to a direction for displaying the image IM, a front surface (or top surface) and a rear surface (or bottom surface) of each element is defined. However, the directional axes DR1, DR2, and DR3 are provided for descriptive purposes, and need not be the directions shown. Hereinafter, first to third directions are respectively indicated by the first to third directional axes DR1, DR2, and DR3.

Although a smartphone is illustrated as an example of the electronic device ED, embodiments of the inventive concept are not limited thereto. According to an exemplary embodiment of the present inventive concept, the electronic device ED may be a tablet computer, a notebook computer, or a smart television.

As illustrated in FIGS. 1 to 3C, the electronic device ED includes a display module DM, an electronic module EM, a power module PM, a bottom cover BC, and top covers TC1 and TC2.

The display module DM may include a display panel layer DP (or a display panel) displaying the image IM and a touch sensing layer TS (or a touch sensing unit) sensing an external input. The display surface DS may also function as an input surface on which a user's touch may be sensed. The display module DM may be electrically connected to the electronic module EM, for example, through a flexible circuit board.

The display module DM includes stepped areas EA1 and EA2 and a central area CA. Two stepped areas EA1 and EA2 are illustrated in FIG. 2 as an example, but there may be another number of stepped areas. Each of the stepped areas EA1 and EA2 is stepped in recess from the central area CA.

The electronic module EM may include various functional modules for operating the electronic device ED. For example, the electronic module EM may include a control module 10 (e.g. a processor), a wireless communication module 20 (e.g. a radio), an image input module 30 (e.g. a video signal processor), a sound input module 40 (e.g. an audio signal processor/microphone), a sound output module 50 (e.g. an audio-out port or speaker), a memory 60 (e.g. a flash memory device), an external interface 70 (e.g. a universal serial bus (USB) interface), a light emitting module 80 (e.g. a light source), a light receiving module 90 (e.g. a photo-sensor), a camera module 100, and the like. One portion of the modules may be mounded on a main circuit board, and the other portion of the modules may be electrically connected to the main circuit board through the flexible circuit board.

The control module 10 controls an overall operation of the electronic device ED. For example, the control module 10 activates or deactivates the display module DM. The control module 10 may control, on the basis of a touch signal received from the display module DM, the image input module 30, the sound input module 40, the sound output module 50, and the like.

The wireless communication module 20 transmits/receives a wireless signal to/from another terminal, for example, using Bluetooth, cellular wireless standards (e.g. LTE) and/or WiFi link. The wireless communication module 20 may use a general communication line to transmit/receive a sound signal. The wireless communication module 20 includes a transmission unit 24 modulating a signal to be transmitted and transmitting the modulated signal, and a receiving unit 22 demodulating the received signal.

The image input module 30 processes an image signal to convert the image signal into image data that is displayable on the display module DM. The sound input module 40 receives an external sound signal through a microphone in a recording mode or a voice recognition mode to convert the received sound signal into electrical voice data. The sound output module 50 converts acoustic data received from the wireless communication module 20 or acoustic data stored in the memory 60 to output the converted acoustic data to the outside.

The external interface 70 serves as an interface connected to an external charger, a wired/wireless data port, a card socket (e.g., memory card socket and SIM/UIM card socket), or the like.

The light emitting module 80 generates and outputs light. The light emitting module 80 may output infrared rays. The light emitting module 80 may include an LED device. The light receiving module 90 may sense infrared rays. The light receiving module 90 may be activated when infrared rays above a predetermined amplitude is detected. The light receiving module 90 may include a CMOS sensor. Infrared light generated from the light emitting module 80 may be outputted and then reflected by an external object (e.g. user's finger or face), and the reflected infrared light may be incident into the light receiving module 90. The camera module 100 captures an external image.

The power module PM provides power for the operation of the electronic device ED. The power module PM may include a conventional battery.

The bottom cover BC is disposed below and coupled to the display module DM. Although an example of one bottom cover BC is illustrated, the bottom cover BC may include two or more portions that are coupled to each other.

For example, the bottom cover BC may include a first cover and a second cover, which are made of different materials or the same material as each other. The first cover may be made of metal and coupled to the top covers TC1 and tC2 or the display module DM. The second cover may include a glass substrate or a plastic substrate and may be coupled to the first cover.

The top covers TC1 and TC2 are disposed above the display module DM, overlap a portion of the display module DM, and are coupled to the display module DM or the bottom cover BC. Two top covers TC1 and TC2 (hereinafter, referred to as a first top cover TC1 and a second top cover TC2) respectively corresponding to two stepped areas EA1 and EA2 are exemplarily illustrated. The top covers TC1 and TC2 may cover the stepped areas EA1 and EA2, respectively. The top covers TC1 and TC2 may each have stepped portions that engage with the stepped portions of the areas EA1 and EA2, respectively.

Each of the top covers TC1 and TC2 may be coupled to the display module DM by an adhesive member. The adhesive member may include an adhesive sheet or an adhesive resin. The adhesive member may be disposed on a top surface of each of the stepped areas EA1 and EA2 and a bottom surface of each of the top covers TC1 and TC2.

Each of the top covers TC1 and TC2 may be coupled to the bottom cover BC through structural coupling or an additional coupling unit. As an example of the structural coupling, one of the top covers TC1 and TC2 and the bottom cover BC may include a protrusion, and the other thereof may include a groove into which the protrusion is inserted. As an example of the additional coupling unit, the top covers TC1 and TC2 and the bottom cover BC may be coupled to each other using a screw.

The bottom cover BC and the top covers TC1 and TC2 form an outer surface of the electronic device ED. The bottom cover BC and the top covers TC1 and TC2 may have the same color as each other. The bottom cover BC and the top covers TC1 and TC2 may have a color such as gold, silver, blue, navy blue, pink, or green. As the bottom cover BC and the top covers TC1 and TC2 may be made of the same material as each other, they may have the same color as each other.

Each of the bottom cover BC and the top covers TC1 and TC2 may include colored layers disposed on a base member and an outer surface of a base member. As the colored layers of the bottom cover BC and the top covers TC1 and TC2 include the same material as each other, the bottom cover BC and the top covers TC1 and TC2 may have the same color as each other. Here, the base members of the bottom cover BC and the top covers TC1 and TC2 may be made of either the same material or different materials from each other. The base members of the bottom cover BC and the top covers TC1 and TC2 may include a metal substrate or a plastic substrate. The colored layers of the bottom cover BC and the top covers TC1 and TC2 may be formed on the respective base member in the same method, e.g., a deposition, printing, or coating method.

The electronic device ED may further include an intermediate cover disposed between the bottom cover BC and the top covers TC1 and TC2.

Referring to FIGS. 3A to 3C, the first top cover TC1 may include light transmitting areas TA1, TA2, and TA3 and a light shielding area NTA. Areas on which a colored layer TC1-CL is not disposed, e.g., opening areas of the colored layer TC1-CL, may be defined as the light transmitting areas TA1, TA2, and TA3, and areas on which the colored layer TC1-CL is disposed may be defined as the light shielding area NTA. Although the first to third light transmitting areas TA1, TA2, and TA3 are exemplarily illustrated, one light transmitting area may be sufficient. Although the colored layer TC1-CL is illustrated as disposed on an inner surface of a base member TC1-B, the colored layer TC1-CL may alternatively be disposed on an outer surface of the base member TC1-B.

The first to third light transmitting areas TA1, TA2, and TA3 are defined as areas through which light passes. The first to third light transmitting areas TA1, TA2, and TA3 do not overlap the display module DM and are instead aligned to the light emitting module 80, the light receiving module 90, and the camera module 100.

The light emitting module 80, the light receiving module 90, and the camera module 100 are disposed in a space defined by the first top cover TC1 and the bottom cover BC (for example, as may be seen in FIG. 2) and may respectively overlap the first to third light transmitting areas TA1, TA2, and TA3.

According to an exemplary embodiment of the present inventive concept, the first to third light transmitting areas TA1, TA2, and TA3 may correspond to areas in which first to third through-holes passing through the base member TC1-B are defined.

The light transmitting areas may also be defined in the second top cover TC2. The second top cover TC2 may have the same constitution as that of the first top cover TC1.

Figure 4:
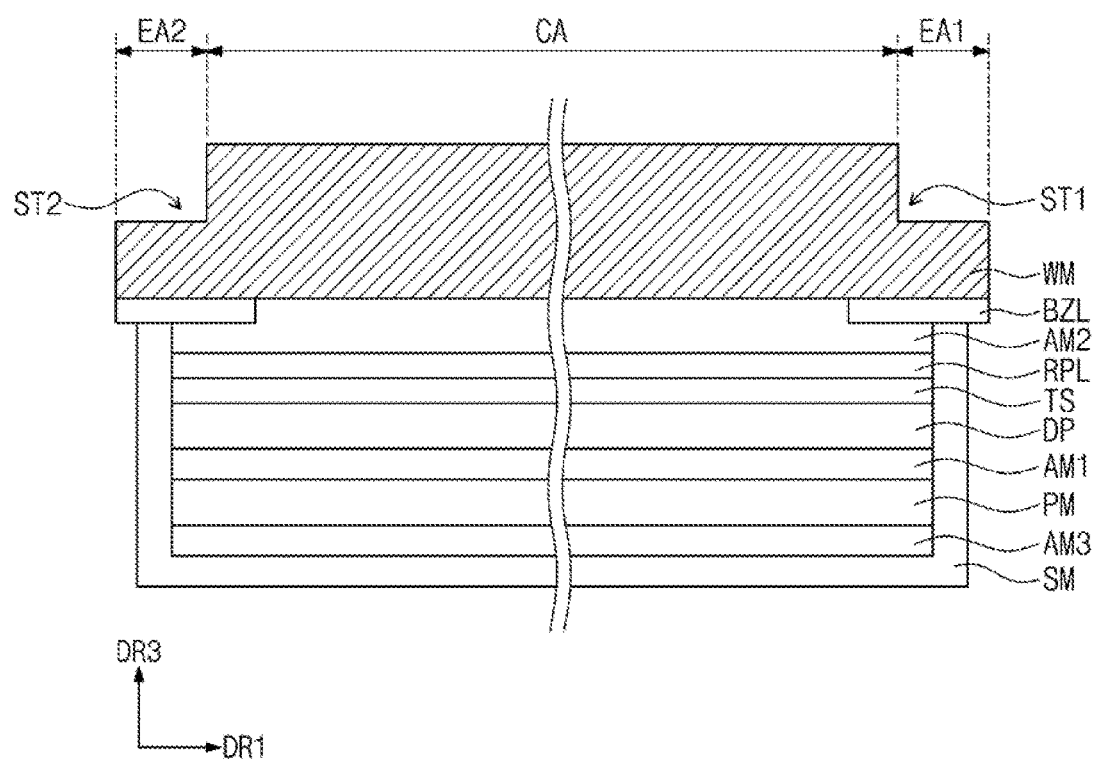
FIG. 4 is a cross-sectional view illustrating a display module according to an exemplary embodiment of the present inventive concept.
Figure 5A:
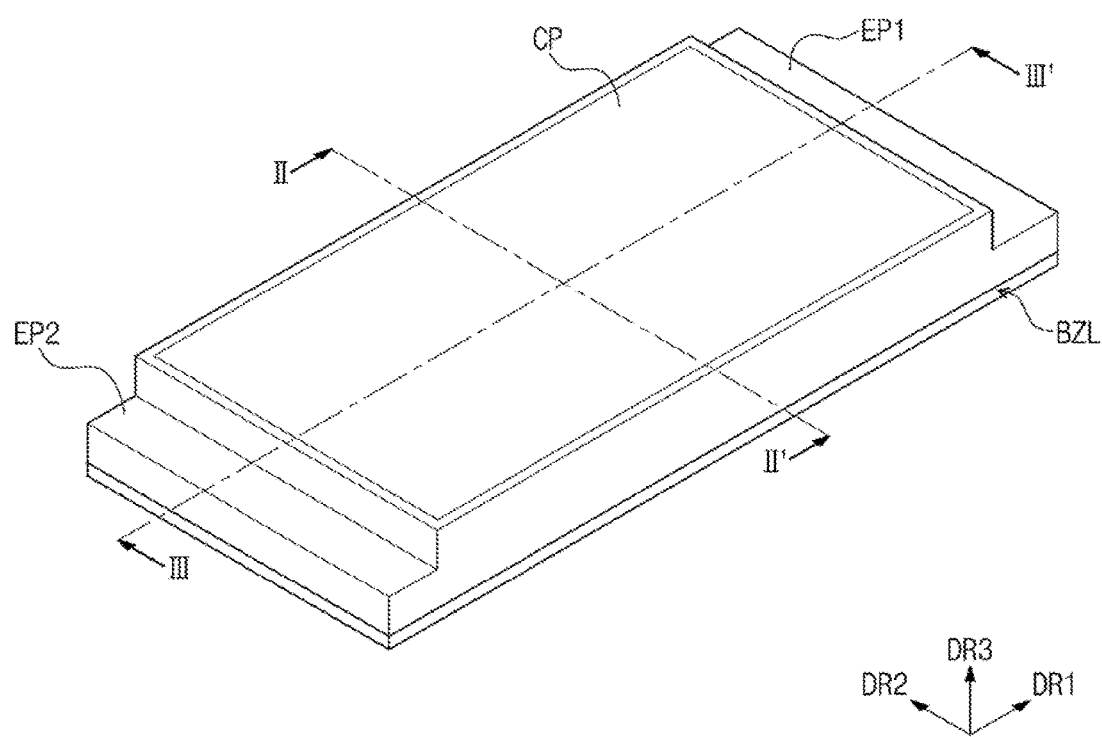
FIG. 5A is a perspective view illustrating a display window according to an exemplary embodiment of the present inventive concept.
Figure 5B:
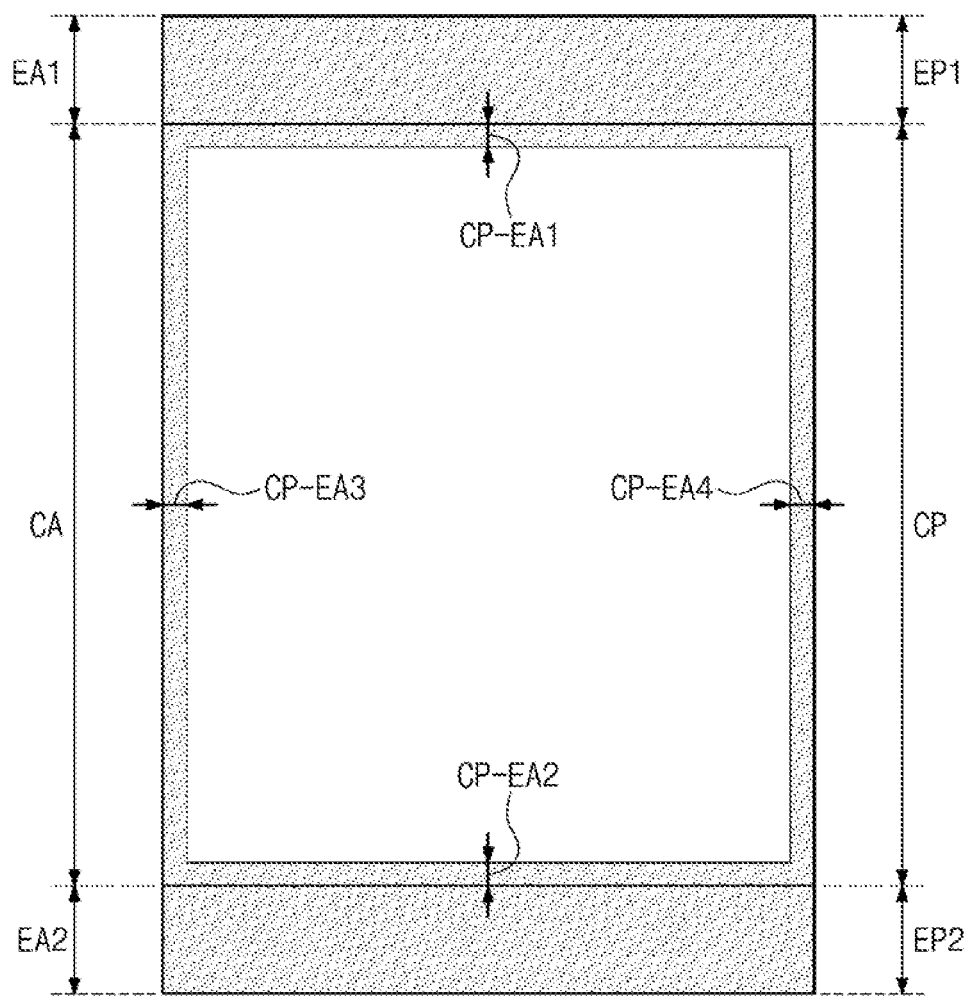
FIG. 5B is a plan view illustrating a display window according to an exemplary embodiment of the present inventive concept.
Figure 5B:
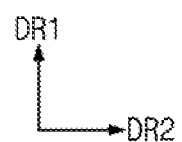
Figure 6A:
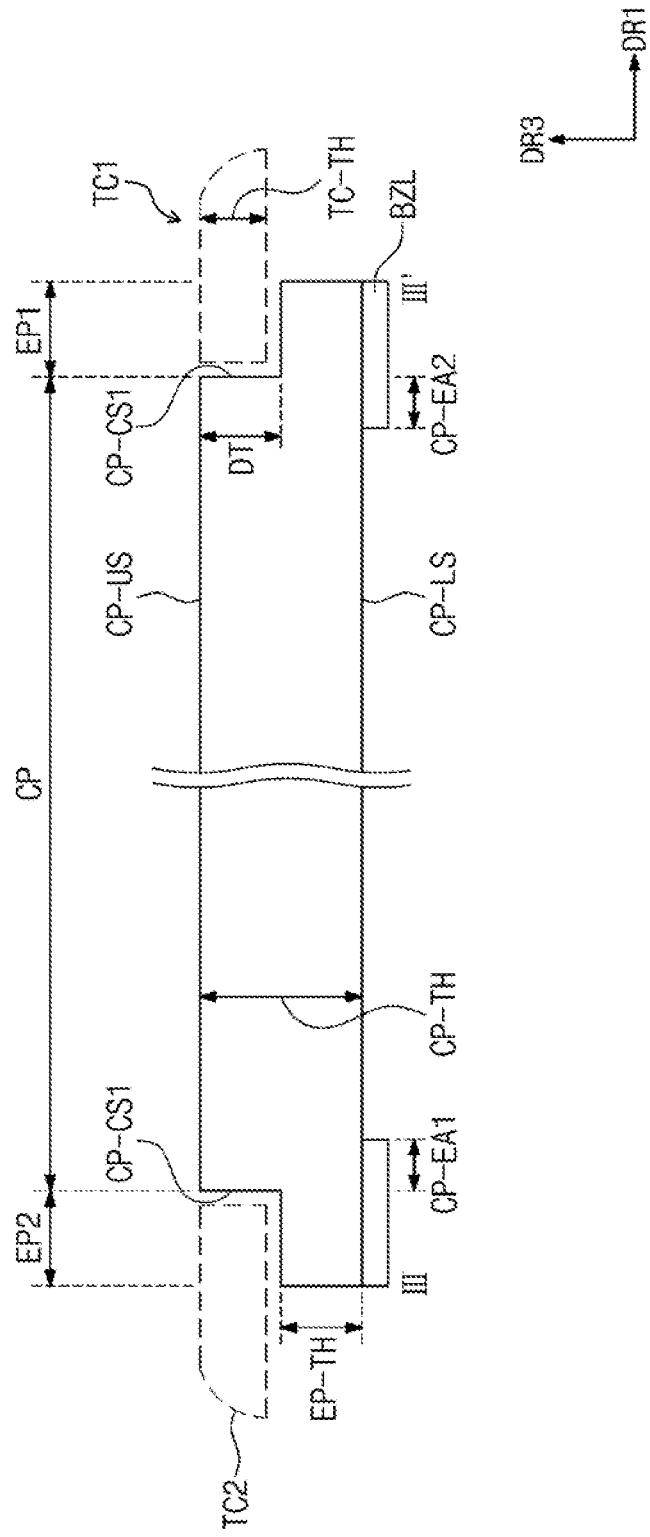
FIGS. 6A to 6C are cross-sectional views illustrating a display window according to an exemplary embodiment of the present inventive concept.
Figure 6B:
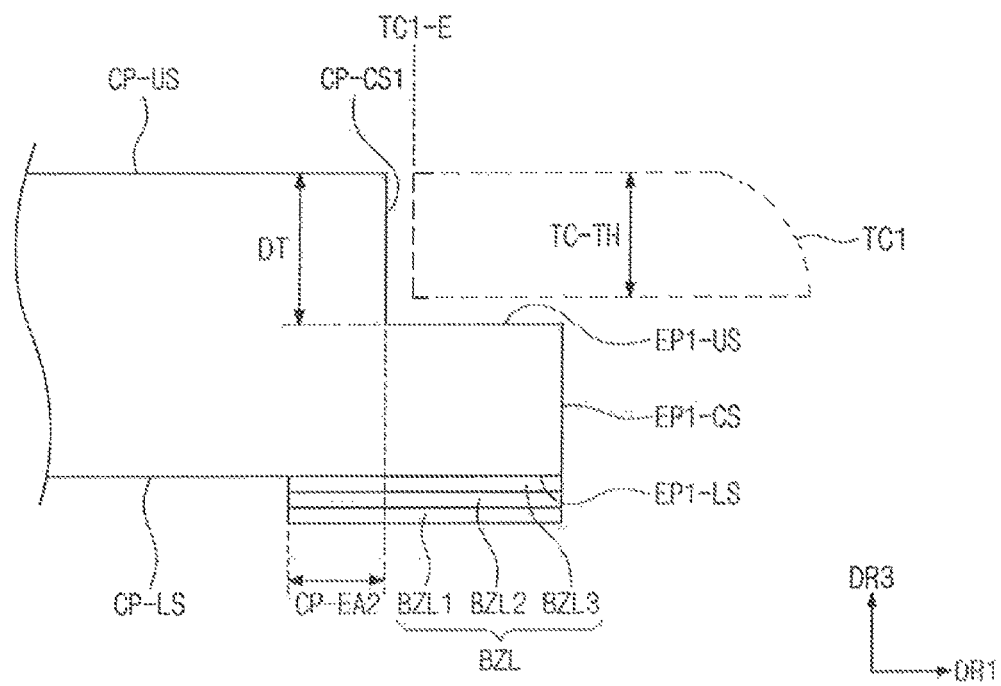
Figure 6C:
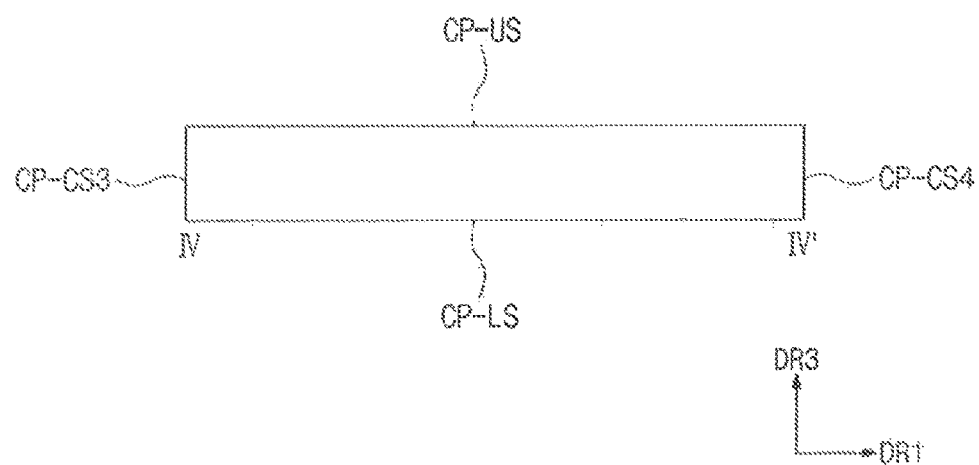

FIG. 4 is a cross-sectional view illustrating the display module DM according to an exemplary embodiment of the present inventive concept. FIG. 5A is a perspective view illustrating a display window member WM according to an exemplary embodiment of the present inventive concept. FIG. 5B is a plan view illustrating the display window member WM according to an exemplary embodiment of the present inventive concept. FIGS. 6A to 6C are cross-sectional views illustrating the display window member according to an exemplary embodiment of the present inventive concept. FIG. 6B is an enlarged view illustrating a portion of FIG. 6A.

As illustrated in FIG. 4, the display module DM includes a support member SM, a protective film PF, a display panel layer DP, a touch sensing layer TS, a reflection preventing layer RPL (or reflection preventing unit), a display window member WM, a bezel layer BZL, and adhesive layers AM1, AM2, and AM3. According to an embodiment of the inventive concept, the support member SM, the protective film PF, the touch sensing layer TS, the reflection preventing layer RPL, and the adhesive layers AM1, AM2, and AM3 may be omitted. When each of the support member SM, the protective film PF, the touch sensing layer TS, and the reflection preventing layer RPL has a corresponding function that is unnecessary to the functioning of the display module DM, according to an exemplary embodiment of the present inventive concept, or is replaced by another component having the corresponding function, the unnecessary element may be omitted. The adhesive layers AM1, AM2, and AM3 may be omitted when two components that are objects to be coupled are manufactured in a continuous process. Also, the adhesive layers AM1, AM2, and AM3 may be replaced by structural coupling between the two components or an additional coupling unit. According to an exemplary embodiment of the present inventive concept, the display module DM may further include a functional layer disposed on an outer surface of the display window member WM. The functional layer may include a hard coating layer, an anti-fingerprint layer, and a reflection preventing layer.

Each of the adhesive layers AM1, AM2, and AM3 may include an optically clear adhesive film OCA, an optically clear resin OCR, or a pressure sensitive adhesive film PSA. Each of the adhesive layers AM1, AM2, and AM3 may include a light curing adhesive material and/or a thermal curing adhesive material.

The protective film PF is disposed below the display panel layer DP. The first adhesive layer AM1 attaches the protective film PF to the display panel layer DP. The protective film PF protects the display panel layer DP. The protective film PF prevents external moisture from being introduced into the display panel layer DP and the protective film PF may absorb external shock, thereby protecting the display panel layer DP from damage.

The protective film PF may include a plastic film manufactured by a separate molding process as a base layer. The protective film PF may include the plastic film such as polyethersulphone (PES), polyacrylate (PAR), polyetherimide (PEI), polyethyelenen napthalate (PEN), polyethyelene-terepthalate (PET), polyphenylene sulfide (PPS), polyally-late, polyimide (PI), polycarbonate (PC), and/or poly (aryleneether sulfone).

The protective film PF may include plastic resins or an organic/inorganic composite material. For example, the protective film PF may include a porous organic layer and inorganic materials filled in pores of the organic layer.

The protective film PF may further include a functional layer disposed on a plastic film. The functional layer may include a resin layer. The functional layer may be formed in a coating method.

The touch sensing layer TS and the reflection preventing layer RPL are disposed on the display panel layer DP. The stacking sequence of the touch sensing layer TS and the reflection preventing layer RPL may be set according to various factors, and the present inventive concept is not limited to any particular sequence. The touch sensing layer TS may be directly disposed on the display panel layer DP through the continuous process, and the reflection preventing layer RPL may be directly disposed on the touch sensing layer TS through the continuous process.

The display panel layer DP may correspond to a conventional organic light emitting display panel, electrophoretic display panel, electrowetting display panel, or the like, and any other form of display panel may be used.

The touch sensing layer TS acquires coordinate information of an external input, such as touch. According to an exemplary embodiment of the present inventive concept, the touch sensing layer TS may be a capacitive type touch sensing member. However, the present inventive concept is not limited thereto. For example, the touch sensing layer TS may be replaced by another type of touch sensing layer that includes two types of touch electrodes, for example, an electromagnetic induction method.

The reflection preventing layer RPL absorbs or destructively interferes light incident from the outside (e.g. ambient light) to reduce glare on the display device. The reflection preventing layer RPL may include a color filter absorbing light. The reflection preventing layer RPL may include a first reflective index layer, a second reflective index layer, and a destructive interference structure of the first reflective index layer.

The touch sensing layer TS and the reflection preventing layer RPL, which are formed in the continuous process, reduces a thickness of the display module DM. According to an exemplary embodiment of the present inventive concept, the touch sensing layer TS and the reflection preventing layer RP may be respectively replaced by a touch panel and an optical film (e.g. a polarizing film and a retarder film). The touch panel and the optical film may be coupled to each other on the display panel layer DP through the adhesive layer.

The display window member WM may be disposed above the display module DM to protect the display module DM from external shock and provide the display surface DS (refer to FIG. 1) and an input surface to the user. The display window member WM will be described in detail with reference to FIGS. 4 to 6C.

The display surface DS may be defined as a portion of a top surface of the display window member WM that is exposed to the outside. The portion may correspond to a central top surface CP-US of the display window member WM. The stepped areas EA1 and EA2 and central area CA of the display module DM are defined by stepped portions ST1 and ST2 of the display window member WM. The display window member WM includes edge portions EP1 and EP2 connected to the central portion CP to provide the central portion CP and the stepped portions ST1 and ST2. The edge portions EP1 and EP2 may include a first edge portion EP1 and a second edge portion EP2, which correspond to the first stepped portion ST1 and the second stepped portion ST2, respectively.

The first edge portion EP1 and the second edge portion EP2 may be respectively covered by the first top cover TC and the second top cover TC2. Each of the first edge portion EP1 and the second edge portion EP2 may be thinner than the central portion CP. A thickness EP-TH of each of the first edge portion EP1 and the second edge portion EP2 may be smaller than a thickness CP-TH of the central portion CP. The thicknesses EP-TH of the first edge portion EP1 may be substantially the same as the thickness of the second edge portion EP2. Alternatively, the thicknesses EP-TH of the first edge portion EP1 may be different than the thickness of the second edge portion EP2.

A depth DT of each of the first stepped portion ST1 and the second stepped portion ST2 may be the same as or less than a thickness TC-TH of each of the first top cover TC1 and the second top cover TC2. When the depth DT of each of the first stepped portion ST1 and the second stepped portion ST2 and the thickness TC-TH of each of the first top cover TC1 and the second top cover TC2 are the same as each other, the display window member WM, the first top cover TC1, and the second top cover TC2 may provide a flat outer surface. The first top cover TC1 and the second top cover TC2 are illustrated by a dotted line in FIGS. 6A and 6B.

As illustrated in FIGS. 6A to 6C, the central portion CP may include a central bottom surface CP-LS, a central top surface CP-US facing the central bottom surface CP-LS in a normal direction DR3 of the central bottom surface CP-LS, and connecting surfaces CP-CS1 to CP-CS4 connecting the central bottom surface CP-LS to the central top surface CP-US. The first and second connecting surfaces CP-CS1 and CP-CS2 face each other in a first direction DR1, and the third and fourth connecting surfaces CP-CS3 and CP-CS4 face each other in a second direction DR2.

The first edge portion EP1 and the second edge portion EP2 are connected to the first connecting surface CP-CS1 and the second connecting surface CP-CS2, respectively. Each of the first edge portion EP1 and the second edge portion EP2 may have a shape extending along the first connecting surface CP-CS1 or the second connecting surface CP-CS2 in the second direction DR2.

The first edge portion EP1 and the second edge portion EP2 may be integrated with the central portion CP. The first edge portion EP1 and the second edge portion EP2 extend from the first connecting surface CP-CS1 and the second connecting surface CP-CS2, respectively. As two facing edge areas of a tempered glass substrate are partially removed in the thickness direction DR3 by using a cutting bite or a slotter, the first edge portion EP1 and the second edge portion EP2 may be provided. The two facing edge areas of a plastic substrate are polished to provide the first edge portion EP1 and the second edge portion EP2. The plastic display window member may be manufactured according to an injection molding or extrusion molding method.

The edge portion will be described in more detail with reference to the first edge portion EP1 illustrated in FIG. 6B. The first edge portion EP1 is connected to the first connecting surface CP-CS1 and includes an edge top surface EP1-US facing the central top surface CP-US. The edge top surface EP1-US may be parallel to the central top surface CP-US. The central top surface CP-US, the first connecting surface CP-CS1, and the edge top surface EP1-US define the first stepped portion ST1 (for example, as may be seen in FIG. 4).

The first edge portion EP1 includes an edge bottom surface EP1-LS facing the edge top surface EP1-US and an edge side surface EP1-CS connecting the edge top surface EP1-US to the edge bottom surface EP1-LS in the third direction DR3. The edge bottom surface EP1-LS and the edge side surface EP1-CS may be replaced by one inclined surface. The edge bottom surface EP1-LS is disposed on a same plane as the central bottom surface CP-LS.

As illustrated in FIGS. 5A to 6C, the bezel layer BZL is disposed on the bottom surface of the display window member WM. The bezel layer BZL overlaps at least the first edge portion EP1 and the second edge portion EP2. The bezel layer prevents external light from being introduced (for example, the bezel layer may have a light shielding function). Accordingly, a component disposed below the bezel layer BZL may be blocked from the view of a user.

As illustrated in FIG. 5B, the bezel layer BZL may be further disposed on the first edge area CP-EA1 and the second edge area CP-EA2 of the central bottom surface CP-LS, which face each other in the first direction DR1. The bezel layer BZL may be further disposed on the third edge area CP-EA3 and the fourth edge area CP-EA4 of the central bottom surface CP-LS, which face each other in the second direction DR2. In FIG. 5B, an area on which the bezel layer BZL is disposed is shaded and an area on which the bezel layer BZL is not disposed is not shaded.

As illustrated in FIG. 6A, a portion of the bezel layer BZL, which corresponds to the first edge area CP-EA1 and the second edge area CP-EA2, is left exposed by the top covers TC1 and TC2. The user may see the portion of the bezel layer BZL, which corresponds to the first edge area CP-EA1 and the second edge area CP-EA2.

Referring to FIGS. 5B, 6A, and 6B, the portion of the bezel layer BZL left exposed by the top covers TC1 and TC2 may have a shape of a line extending along an edge TC2-E of the top covers TC1 and TC2. The portion of the bezel layer BZL defines a boundary between the display area DA (refer to FIG. 1) and the bezel area BA (refer to FIG. 1).

According to an exemplary embodiment of the present invention, the bezel layer BZL may omit the colored layer. The bezel layer BZL may be achromatic. The bezel layer BZL, according to an exemplary embodiment of the present invention, may define a boundary between the display area DA and the bezel area BA. Since the top covers TC1 and TC2, having the same color as that of the bottom cover BC, covers almost an entirety of the bezel layer BZL, the colored layer having the same color as that of the bottom cover BC may be unnecessary. As the colored layer is omitted, a cost for manufacturing the display module DM is reduced. Since the top covers TC1 and TC2 covers almost an entirety of the bezel layer BZL, poor printing of the bezel layer BZL is not noticeable by a user. Accordingly, the bezel layer may be printed thinly or in a single layer.

FIG. 6B illustrates the bezel layer BZL according to an exemplary embodiment of the present inventive concept. The bezel layer BZL may have a single-layered or a multi-layered structure. The multi-layered bezel layer BZL may include a buffer layer BZL1 improving adhesion force, a pattern layer BZL2 providing a predetermined pattern, and an achromatic layer BZL3. The buffer layer BZL1 may include a transparent inorganic material. The inorganic material may include a silicone oxide and a silicon nitride. When the pattern layer BZL2 and the achromatic layer BZL3 are provided on the display window member WM through the buffer layer BZL1, the pattern layer BZL2 and the achromatic layer BZL3 have more adhesion force than that produced when the pattern layer BZL2 and the achromatic layer BZL3 are directly provided on the display window member WM.

The pattern layer BZL2 may provide a hairline pattern. The achromatic layer BZL3 may include an organic mixture containing a black pigment or dye. The above-described layers may be formed by using a method such as a deposition, printing, or coating method. The achromatic layer BZL3 may have a black color.

Referring to FIG. 4 again, the support member SM is disposed below the protective film PF. The third adhesive layer AM3 couples the protective film PF to the support member SM. The support member SM protects components disposed between the display window member WM and the support member SM. The support member SM may include a plastic substrate.

Figure 7:
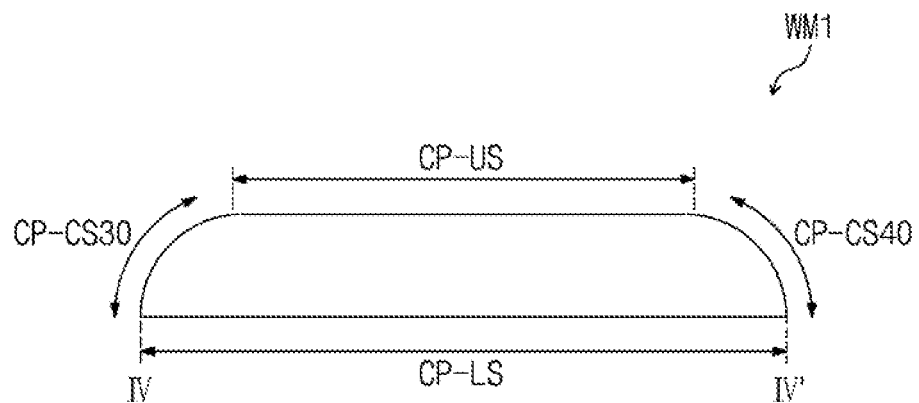
FIGS. 7 and 8 are cross-sectional views illustrating a display window according to an exemplary embodiment of the present inventive concept.
Figure 7:
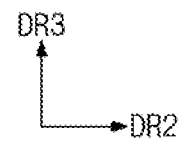
Figure 8:
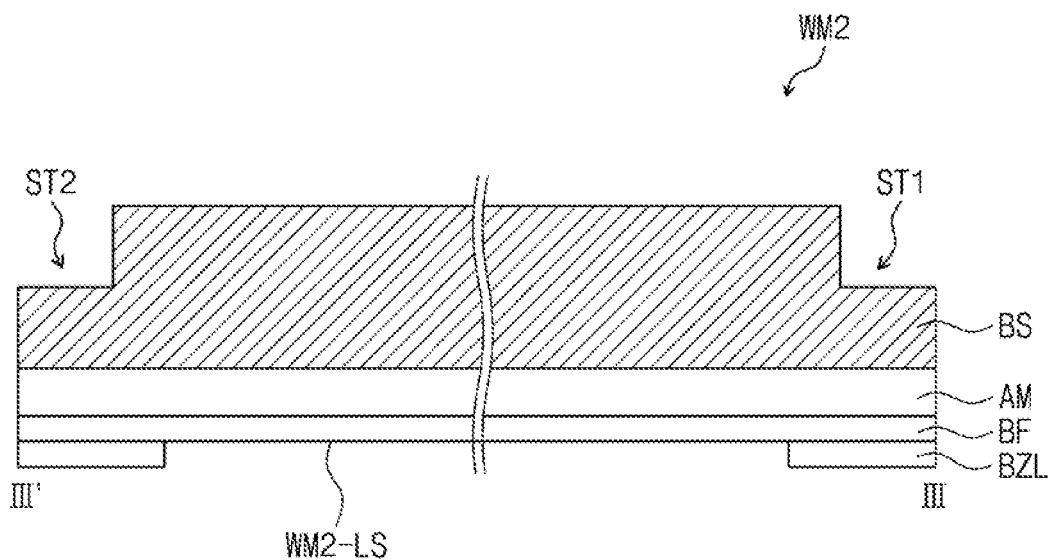
Figure 8:
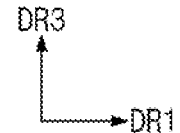

FIGS. 7 and 8 are cross-sectional views of display window members WM1 and WM2 according to an exemplary embodiment of the present inventive concept. FIG. 7 illustrate a cross-section corresponding to FIG. 6C, and FIG. 8 illustrates a cross-section corresponding to FIG. 6A. Hereinafter, the display window member WM will be described primarily with reference to differences between what is shown in FIGS. 1 to 6B and described above.

As illustrated in FIG. 7, each of a third connecting surface CP-CS30 and a fourth connecting surface CP-CS40 of the display window member WM1, which face each other in the second direction DR2, may be a curved surface The third connecting surface CP-CS30 may have a same curvature radius as the fourth connecting surface CP-CS40.

As illustrated in FIG. 8, the display window member WM2 include a base substrate BS, a base film BF disposed below the base substrate BS, and an adhesive layer AM coupling the base film BF to the base substrate BS. The base substrate BS may include a tempered glass substrate or a plastic substrate. The base substrate BS may be substantially the same as the display window member WM described with reference to FIGS. 1 to 6B.

The base film BF provides a bottom surface WM2-LS of the display window member WM2. The bezel layer BZL is disposed on an edge area of the bottom surface WM2-LS. The adhesive layer AM may include an optically clear adhesive film (OCA), an optically clear resin (OCR), or a pressure sensitive adhesive film (PSA). However, the material of the adhesive layer AM is not limited thereto.

Figure 9A:
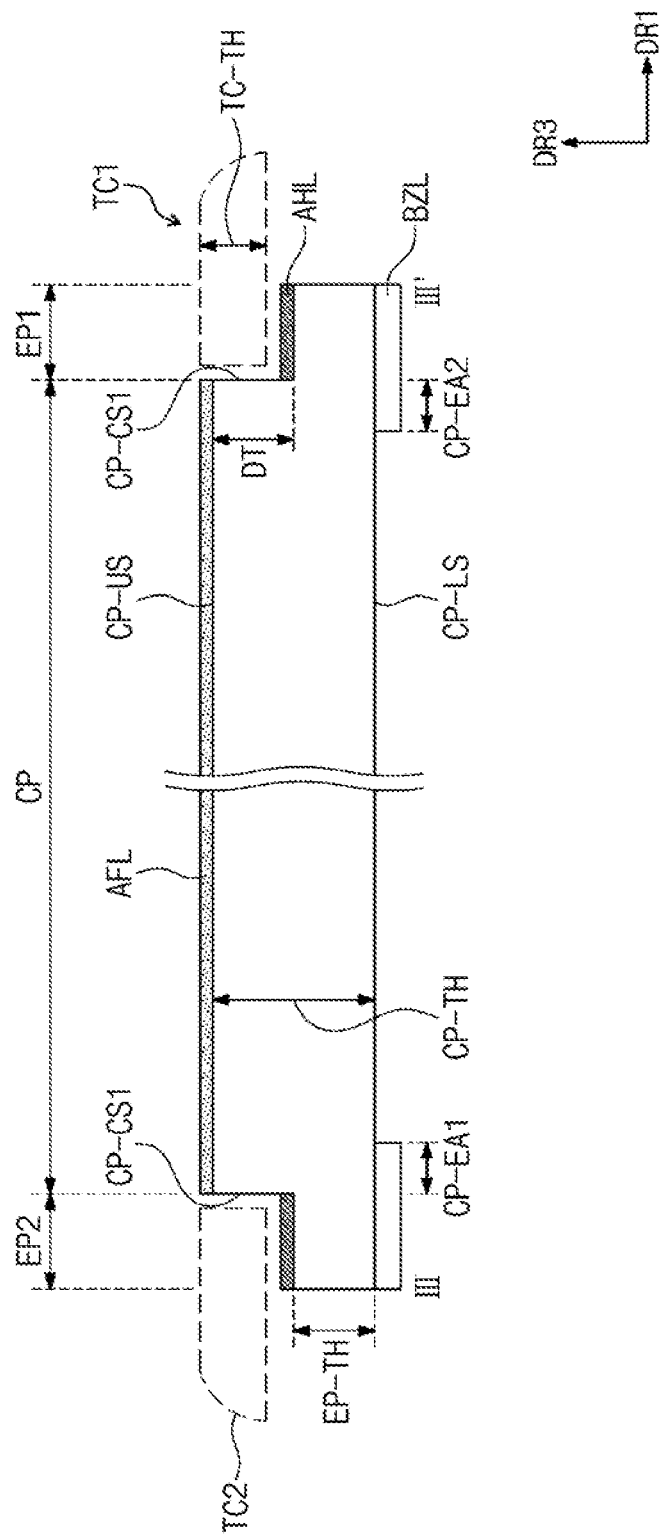
FIGS. 9A and 9B are cross-sectional views illustrating a display window according to an exemplary embodiment of the present inventive concept.
Figure 9B:
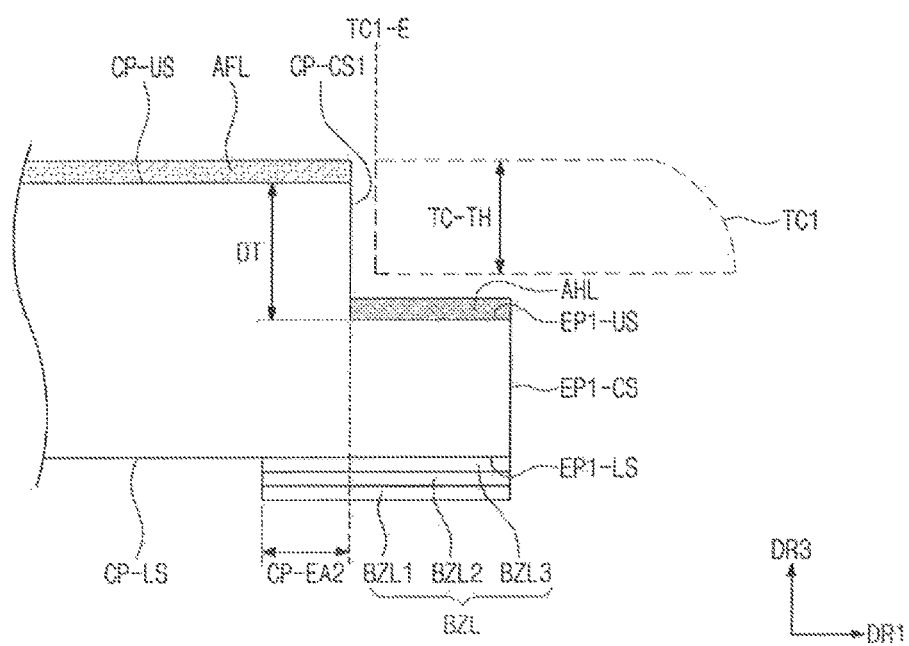
Figure 10:
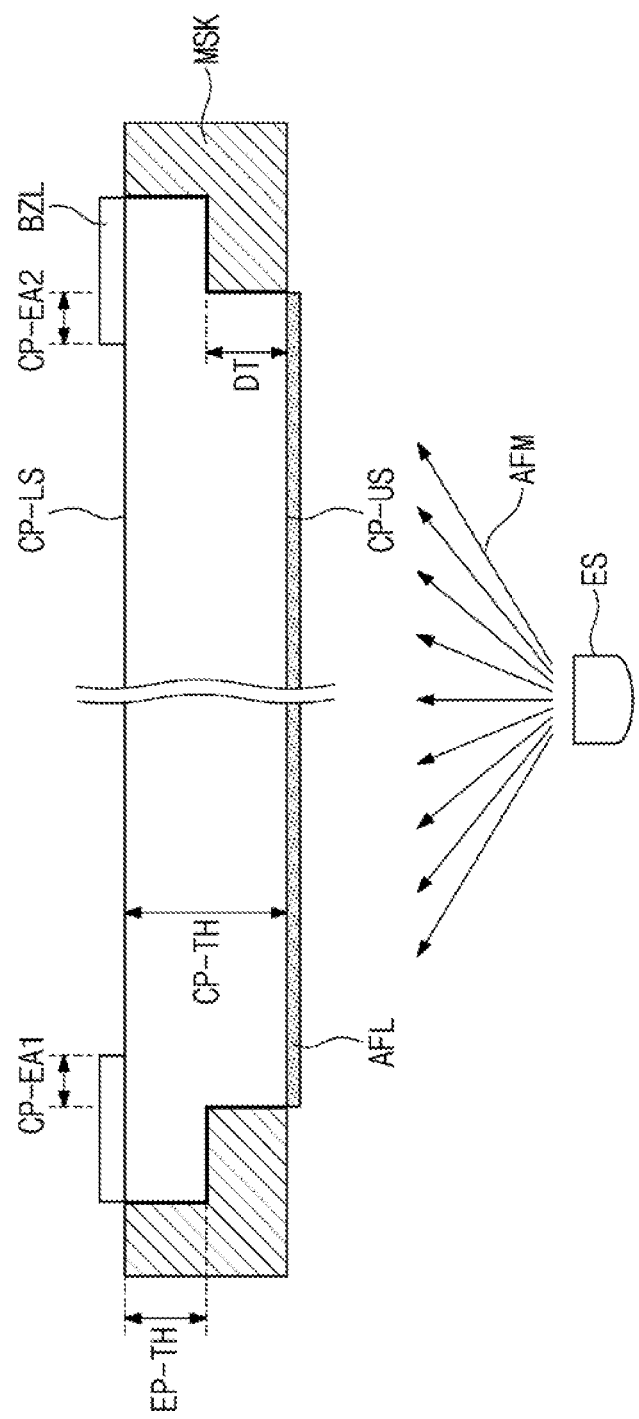
FIG. 10 is a view illustrating a device for manufacturing a functional layer according to an exemplary embodiment of the present inventive concept.

FIGS. 9A and 9B are cross-sectional views illustrating the display window member according to an exemplary embodiment of the present inventive concept. FIG. 10 is a view illustrating a method for manufacturing a functional layer according to an exemplary embodiment of the present inventive concept. The display window member will be described mainly in terms of differences with the display window member described above with reference to FIGS. 6A to 6C.

The display module DM (as may be seen in FIG. 4) according to an exemplary embodiment of the present inventive concept may further include a functional layer AFL. The functional layer AFL may include at least an anti-fingerprint layer. In addition, the functional layer AFL may further include a hard coating layer. The hard coating layer may be disposed below the anti-fingerprint layer. The material of the hard coating layer and the anti-fingerprint layer may be chosen according to known approaches.

The functional layer AFL is disposed on the central top surface CP-US. As illustrated in FIGS. 9A and 9B, the functional layer AFL might not be disposed on the first edge portion EP1 and the second edge portion EP2 of the display window member WM. For example, the functional layer AFL might not be disposed on the edge top surface EP1-US. The functional layer AFL might not be disposed on the connecting surface CP-CS1.

Since the first edge portion EP1 and the second edge portion EP2 of the display window member WM are covered by the first top cover TC1 and the second top cover TC2, the functional layer AFL may be omitted. Moreover, the functional layer AFL may disturb coupling between the display window member WM and the first and second top covers TC1 and TC2 according to the property of the functional layer AFL. For example, a material increasing a surface contact angle such as the material of the anti-fingerprint layer may decrease surface tension to reduce the coupling force between the display window member WM and the first and second top covers TC1 and TC2.

As illustrated in FIGS. 9A and 9B, an adhesive layer AHL is disposed on the first edge portion EP1 and the second edge portion EP2 of the display window member WM. As illustrated in FIG. 9B, the adhesive layer AHL is disposed on the edge top surface EP-US. The adhesive layer AHL couples the display window member WM to the first top cover TC1. When the adhesive layer AHL is disposed on the anti-fingerprint layer, the coupling force between the display window member and the first top cover TC1 is reduced. As illustrated in FIGS. 9A and 9B, as the functional layer AFL might not be disposed on the first edge portion EP1 and the second edge portion EP2, the coupling force between the display window member WM and the first and second top covers TC1 and TC2 may increase.

As illustrated in FIG. 10, the functional layer AFL may be formed by deposition. For example, the anti-fingerprint layer may be formed by the deposition. A mask MSK supports the first edge portion EP1 and the second edge portion EP2 and exposes the central top surface CP-US. A deposition material AFM is evaporated from the deposition source ES. Accordingly, the functional layer AFL may be formed. The above-described process may be performed in a vacuum chamber. However, the manufacturing methods may be different according to the kinds of the functional layer AFL. For example, the hard coating layer may be formed by a coating or printing method.

Figure 11A:
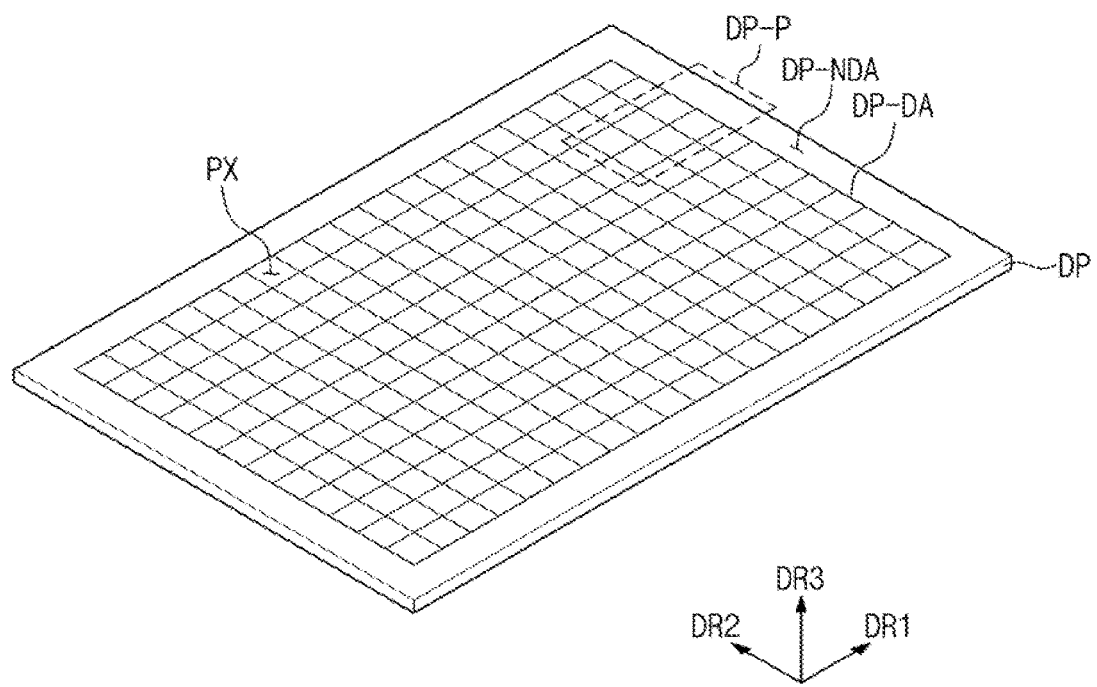
FIG. 11A is a perspective view illustrating a display panel layer according to an exemplary embodiment of the present inventive concept.
Figure 11B:
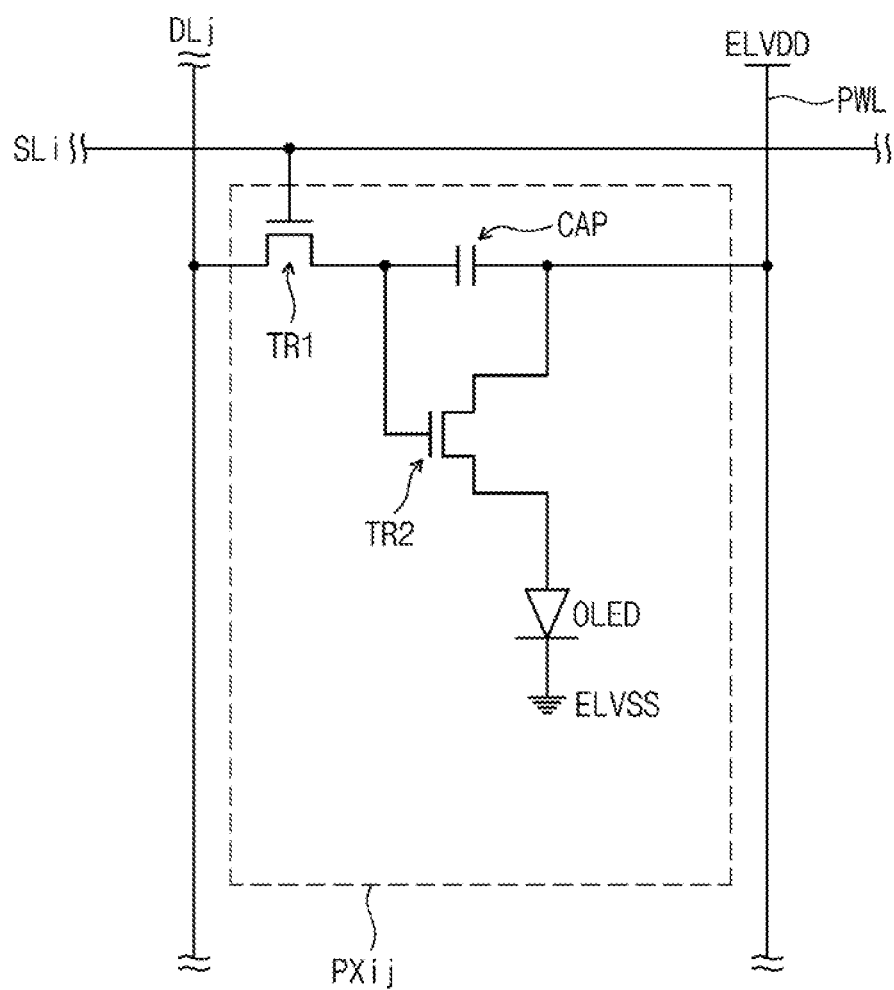
FIG. 11B is an equivalent circuit diagram illustrating a pixel according to an exemplary embodiment of the present inventive concept.
Figure 11C:
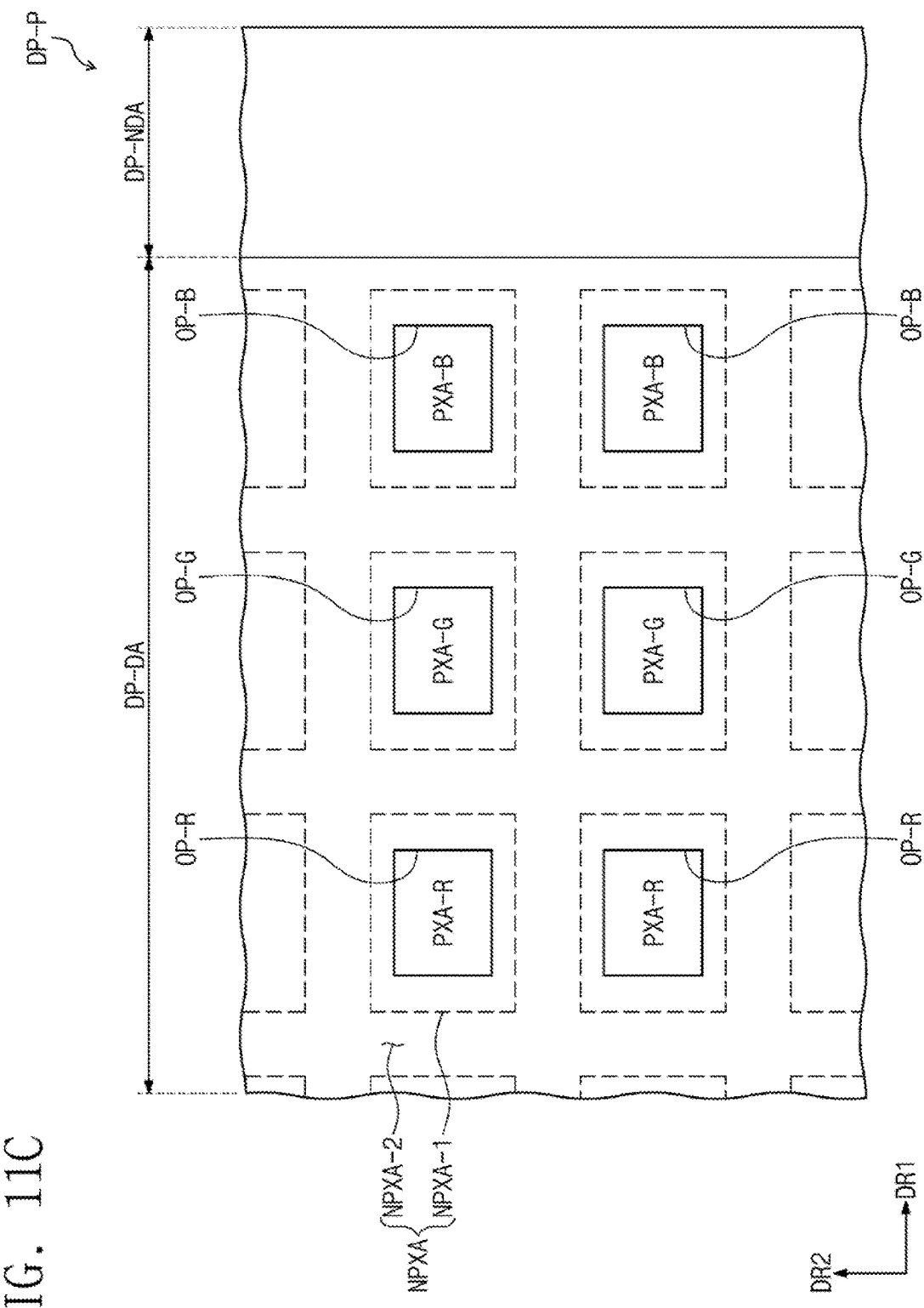
FIG. 11C is a partial plan view illustrating a display panel layer according to an exemplary embodiment of the present inventive concept.
Figure 11D:
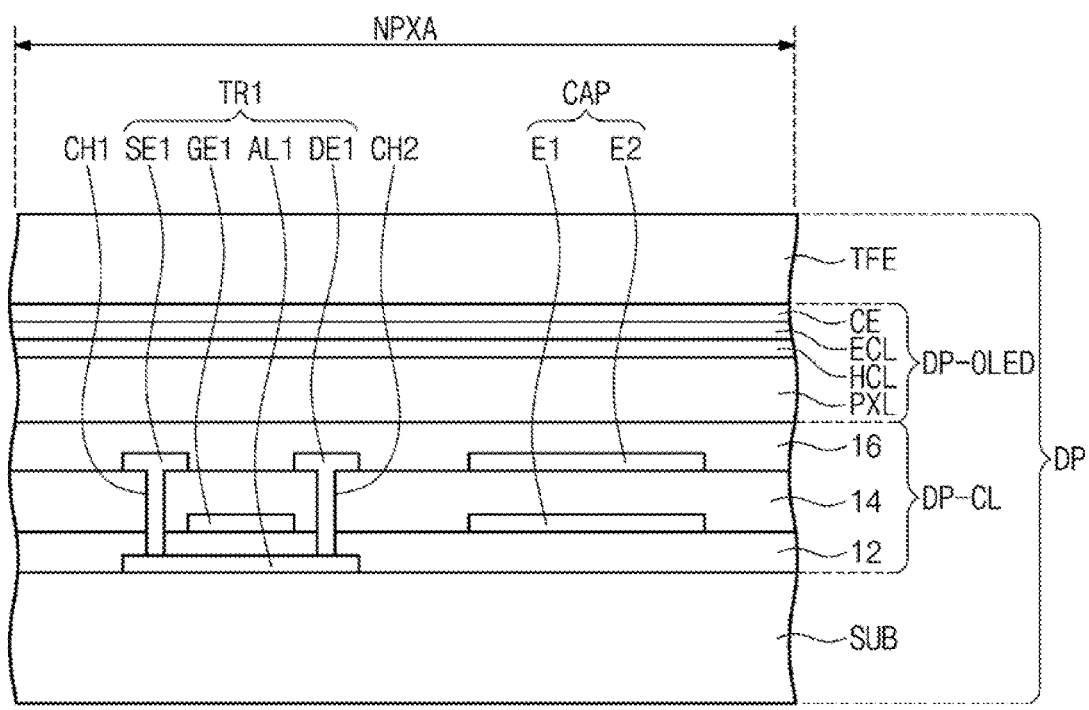
FIGS. 11D and 11E are cross-sectional views illustrating a display panel layer according to an exemplary embodiment of the present inventive concept.
Figure 11E:
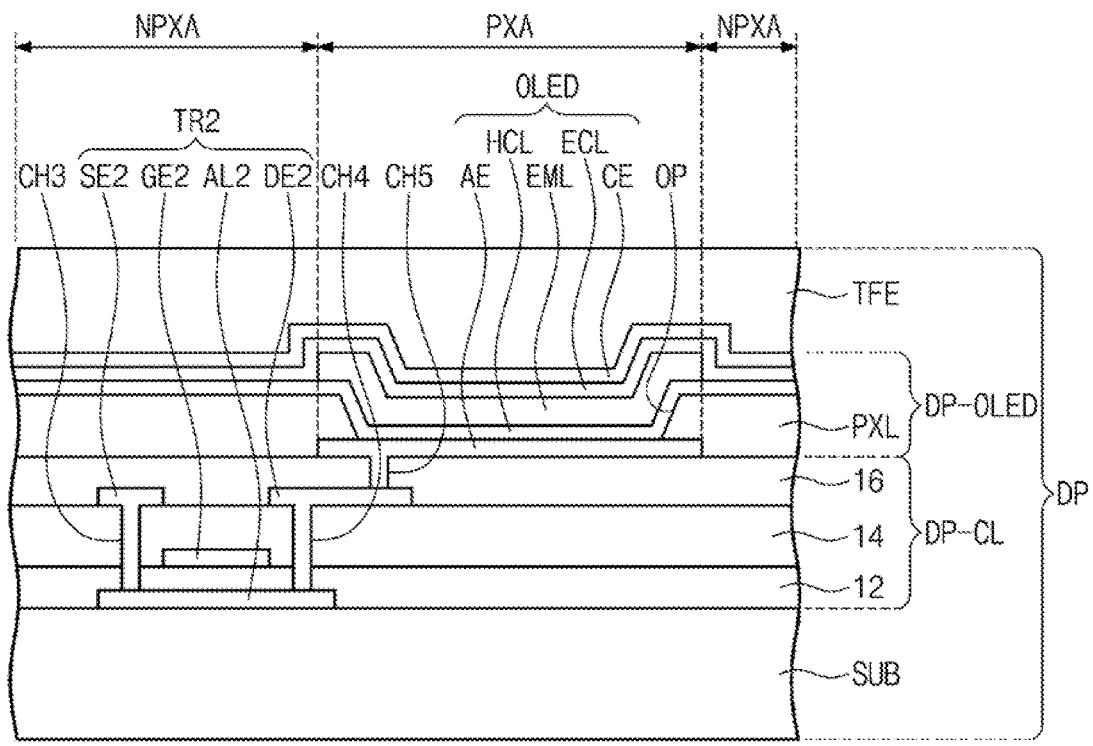

FIG. 11A is a perspective view of the display panel layer DP according to an exemplary embodiment of the present inventive concept. FIG. 11B is an equivalent circuit diagram of a pixel PX according to an exemplary embodiment of the present inventive concept. FIG. 11C is a partial plan view illustrating the display panel layer DP according to an exemplary embodiment of the present inventive concept. FIGS. 11D and 11E are cross-sectional views illustrating the display panel layer DP according to an exemplary embodiment of the present inventive concept.

As illustrated in FIG. 11A, the display panel layer DP according to an exemplary embodiment of the present inventive concept corresponds to an organic light emitting display panel. The display panel layer DP includes a display area DP-DA and a non-display area DP-NDA. The display area DP-DA and the non-display area DP-NDA need not be the same as the display area DA and the bezel area BA of the electronic device ED, and may be varied according to the structure/design of the display panel layer DP.

The display panel layer DP includes a plurality of pixels PX disposed on the display area DP-DA. Although a plurality of pixels PX are arranged in a matrix form, the present inventive concept is not limited thereto. The plurality of pixels PX may be disposed in a non-matrix form, e.g., in a pentile pattern.

FIG. 11B is an equivalent circuit diagram illustrating one pixel PXij connected to i-th injection line SLi and a j-th source line DLj. Although not separately shown, the plurality pixels PX may have the same equivalent circuit.

The pixel PXij includes at least one transistor TR1 or TR2, at least one capacitor CAP, and an organic light emitting device OLED. Although a pixel driving circuit is illustrated as including two transistors TR1 and TR2 and one capacitor CAP, this is but one exemplary embodiment, the constitution of the pixel driving circuit is not limited thereto.

An anode of the organic light emitting device OLED receives a first power voltage ELVDD applied to a power line PWL through the second transistor TR2. A cathode of the organic light emitting device OLED receives a second power voltage ELVSS. The first transistor TR1 outputs a data signal applied to the j-th source line DLj in response to an injection signal applied to the i-th injection line SLi. The capacitor CAP charges a voltage corresponding to the data signal received from the first transistor TR1. The second transistor TR2 controls driving current flowing in the organic light emitting device OLED in correspondence with the voltage stored in the capacitor CAP.

FIG. 11C corresponds to a partial area DP-P illustrated in FIG. 11A. FIG. 11D illustrates a cross-section of a portion corresponding to the first transistor TR1 and the capacitor CAP of the equivalent circuit illustrated in FIG. 11B. FIG. 11E illustrates a cross-section of a portion corresponding to the second transistor TR2 and the organic light emitting device OLED of the equivalent circuit illustrated in FIG. 11B.

As illustrated in FIG. 11C, the display area DP-DA includes a plurality of light emitting areas PXA-R, PXA-G, and PXA-B and a non-light emitting area NPXA on a plane defined by the first directional axis DR1 and the second directional axis DR2. FIG. 11C illustrates three types of light emitting areas PXA-R, PXA-G, and PXA-B disposed in a matrix form. Organic light emitting devices emitting three different colors from each other may be respectively disposed on the three types of light emitting areas PXA-R, PXA-G, and PXA-B. It is to be understood, however, that the light emitting areas need not be so-arranged.

According to an exemplary embodiment of the present inventive concept, the organic light emitting devices emitting white-light may be respectively disposed on the three types of light emitting areas PXA-R, PXA-G, and PXA-B. Here, three types of color filters having a different color from each other may respectively overlap the three types of light emitting areas PXA-R, PXA-G, and PXA-B.

The predetermined color of light maybe emitted by either directly emitting the light generated from the corresponding light emitting device or by converting the color of the light generated from the corresponding light emitting device to emit the converted light of a particular color. According to an exemplary embodiment of the present inventive concept, each of the plurality of light emitting areas PXA-R, PXA-G, and PXA-B may include at least four types of light emitting areas.

The non-light emitting area NPXA may be divided into first non-light emitting areas NPXA-1 surrounding the light emitting areas PXA-R, PXA-G, and PXA-B and second non-light emitting areas NPXA-2 defining boundaries between the first non-light emitting areas NPXA-1. The corresponding driving circuit of the pixel, e.g., the transistors TR1 and TR2 (as may be seen in FIG. 11B) or the capacitor CAP (as may be seen in FIG. 11B) may be disposed on each of the non-light emitting areas NPXA-1. The signal lines, e.g., the injection line SLi (as may be seen in FIG. 11B) and the source line DLj (as may be seen in FIG. 11B), and the power line PWL (as may be seen in FIG. 11B) may be disposed on the second non-light emitting area NPXA-2. However, the present inventive concept is not limited to this particular arrangement. For example, the first non-light emitting areas NPXA-1 and the second non-light emitting areas NPXA-2 might not be divided.

According to an exemplary embodiment of the present inventive concept, each of the light emitting areas PXA-R, PXA-G, and PXA-B may have a shape similar to a rhombus. According to an exemplary embodiment of the present inventive concept, four organic light emitting devices emitting light having a different color from each other may be respectively disposed on the four types of light emitting areas that are repeatedly disposed.

As illustrated in FIGS. 11D and 11E, the display panel layer DP includes a base layer SUB, a circuit layer DP-CL, an organic light emitting device layer DP-OLED, and a thin film encapsulation layer TFE. The circuit layer DP-CL may include a plurality of conductive layers and a plurality of insulation layers, and the organic light emitting device layer DP-OLED may include a plurality of conductive layers and a plurality of functional organic layers. The thin film encapsulation layer TFE may include at least one organic layer and at least one inorganic layer.

The base layer SUB that is a flexible substrate may include a plastic substrate such as a polyimide substrate, a glass substrate, a metal substrate, or an organic/inorganic composite material substrate. The base layer SUB may have a multi-layered structure.

A semiconductor pattern AL1 (hereinafter, referred to as a first semiconductor pattern) of the first transistor TR1 and a semiconductor pattern AL2 (hereinafter, referred to as a second semiconductor pattern) of the second transistor TR2 are disposed on the base layer SUB. The first semiconductor pattern AL1 and the second semiconductor pattern AL2 may include amorphous silicon formed at a low temperature. The first semiconductor pattern AL1 and the second semiconductor pattern AL2 may include a metal oxide semiconductor. Functional layers may be further disposed on one surface of the base layer SUB. Each of the functional layers includes a barrier layer and/or a buffer layer. The first semiconductor pattern AL1 and the second semiconductor pattern AL2 may be disposed on the barrier layer or the buffer layer.

A first insulation layer 12, covering the first semiconductor pattern AL1 and the second semiconductor pattern AL2, is disposed on the base layer SUB. The first insulation layer 12 includes an organic layer and/or an inorganic layer. For example, the first insulation layer 12 may include a plurality of inorganic thin films. Each of the plurality of inorganic thin films may include a silicon nitride layer and a silicon oxide layer.

A control electrode GE1 (hereinafter, referred to as a first control electrode) of the first transistor TR1 and a control electrode GE2 (hereinafter, referred to as a second control electrode) of the second transistor TR2 are disposed on the first insulation layer 12. A first electrode E1 of the capacitor CAP is disposed on the first insulation layer 12. The first control electrode GE1, the second control electrode GE2, and the first electrode E1 may be manufactured by the same photolithography process as that of the injection line SLi. For example, the first electrode E1 may be made of the same material as that of the injection line SLi.

A second insulation layer 14, covering the first control electrode GE1, the second control electrode GE2, and the first electrode E1, is disposed on the first insulation layer 12. The second insulation layer 14 includes an organic layer and/or an inorganic layer. For example, the second insulation layer 14 may include a plurality of inorganic thin films. Each of the plurality of inorganic thin films may include a silicon nitride layer and a silicon oxide layer.

The source line DLj and the power line PWL may be disposed on the second insulation layer 14. An input electrode SE1 (hereinafter, referred to as a first input electrode) and an output electrode DE1 (hereinafter, referred to as a first output electrode) of the first transistor TR1 are disposed on the second insulation layer 14. An input electrode SE2 (hereinafter, referred to as a second input electrode) and an output electrode DE2 (hereinafter, referred to as a second output electrode) of the second transistor TR2 are disposed on the second insulation layer 14. The first input electrode SE1 branches off of the source line DLj. The second input electrode SE2 branches off of the power line PWL.

A second electrode E2 of the capacitor CAP is disposed on the second insulation layer 14. The second electrode E2 may be manufactured by the same photolithography process as that of the source line DLj and the power line PWL and may be made of the same material.

The first input electrode SE1 and the first output electrode DE1 are connected to the first semiconductor pattern AL1 through a first through-hole CH1 and a second through-hole CH2, respectively, which pass through the first insulation layer 12 and the second insulation layer 14. The first output electrode DE1 may be electrically connected to the first electrode E1. For example, the first output electrode DE1 may be connected to the first electrode E1 through a through-hole passing through the second insulation layer 14. The second input electrode SE2 and the second output electrode DE2 are connected to the second semiconductor pattern AL2, respectively, through a third through-hole CH3 and a fourth through-hole CH4, which pass through the first insulation layer 12 and the second insulation layer 14. According to an exemplary embodiment of the present inventive concept, the first transistor TR1 and the second transistor TR2 may alternatively be embodied in a bottom gate structure.

A third insulation layer 16, covering the first input electrode SE1, the first output electrode DE1, the second input electrode SE2, and the second output electrode DE2, is disposed on the second insulation layer 14. The third insulation layer 16 includes an organic layer and/or an inorganic layer. In particular, the third insulation layer 16 may include an organic material to provide a flat surface.

A pixel defining film PXL and an organic light emitting device OLED are disposed on the third insulation layer 16. An opening OP is defined in the pixel defining film PXL. The pixel defining film PXL serves as another insulation layer. The opening OP in FIG. 11E may correspond to the openings OP-R, OP-G, and OP-B in FIG. 11C.

An anode AE is connected to the second output electrode DE2 through a fifth through-hole CH5 passing through the third insulation layer 16. The opening OP of the pixel defining film PXL exposes at least a portion of the anode AE. A hole control layer HCL may be commonly defined in the light emitting areas PXA-R, PXA-G, and PXA-B and the non-light emitting area NPXA. An organic light emitting layer EML and the electron control layer ECL may be sequentially provided on the hole control layer HCL. The hole control layer HCL includes at least a hole transport layer, and the electron control layer ECL includes at least an electron transport layer. Thereafter, the cathode CE may be commonly defined in the light emitting areas PXA-R, PXA-G, and PXA-B and the non-light emitting area NPXA. The cathode CE may be defined by a deposition or sputtering method according to a layer structure of the cathode CE.

The thin film encapsulation layer TFE encapsulating the organic light emitting device layer EP-OLED is disposed on the cathode CE. The thin film encapsulation layer TFE includes at least two inorganic thin films and an organic thin film disposed therebetween. The inorganic thin films may protect the organic light emitting device OLED from moisture and oxygen, and the organic thin film may protect the organic light emitting device OLED from foreign substances such as dust particles.

According to an exemplary embodiment of the present invention, the light emitting area PXA may be defined as an area generating light. The light emitting area PXA may be defined to correspond to the anode AE or light emitting layer EML of the organic light emitting device OLED. Although the patterned organic light emitting layer EML is illustrated according to an exemplary embodiment of the present invention, the organic light emitting layer EML may be commonly disposed on the non-light emitting area NPXA and the light emitting areas PXA-R, PXA-G, and PXA-B. Here, the organic light emitting layer EML may generate white-light.

Figure 12A:
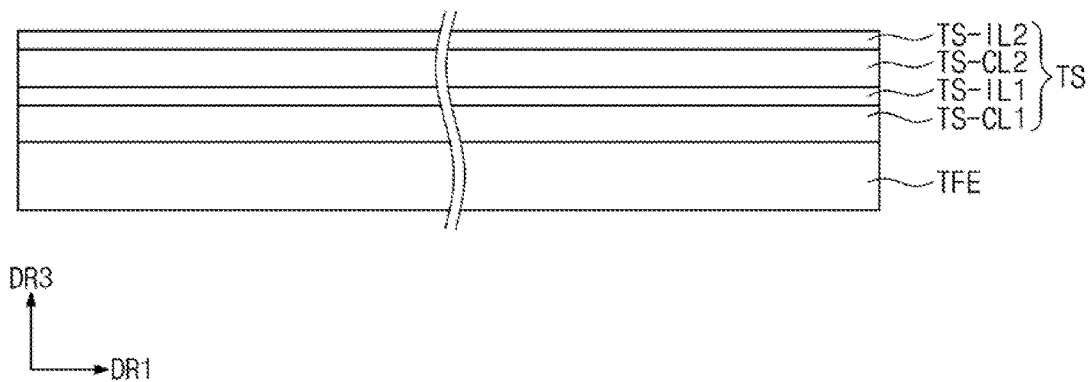
FIG. 12A is a cross-sectional view illustrating a touch sensing layer according to an exemplary embodiment of the present inventive concept.
Figure 12B:
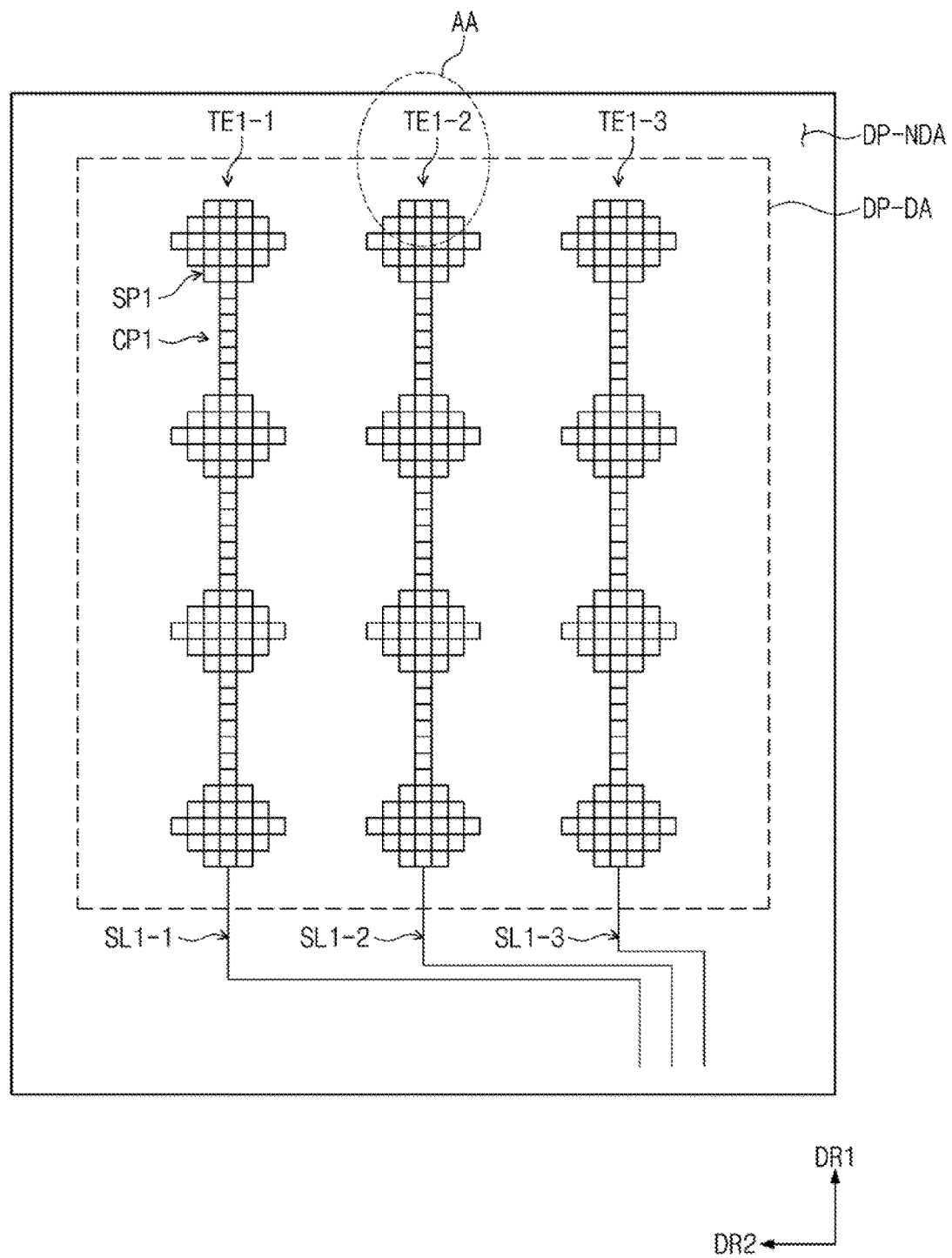
FIGS. 12B and 12C are plan views illustrating a touch sensing layer according to an exemplary embodiment of the present inventive concept.
Figure 12C:
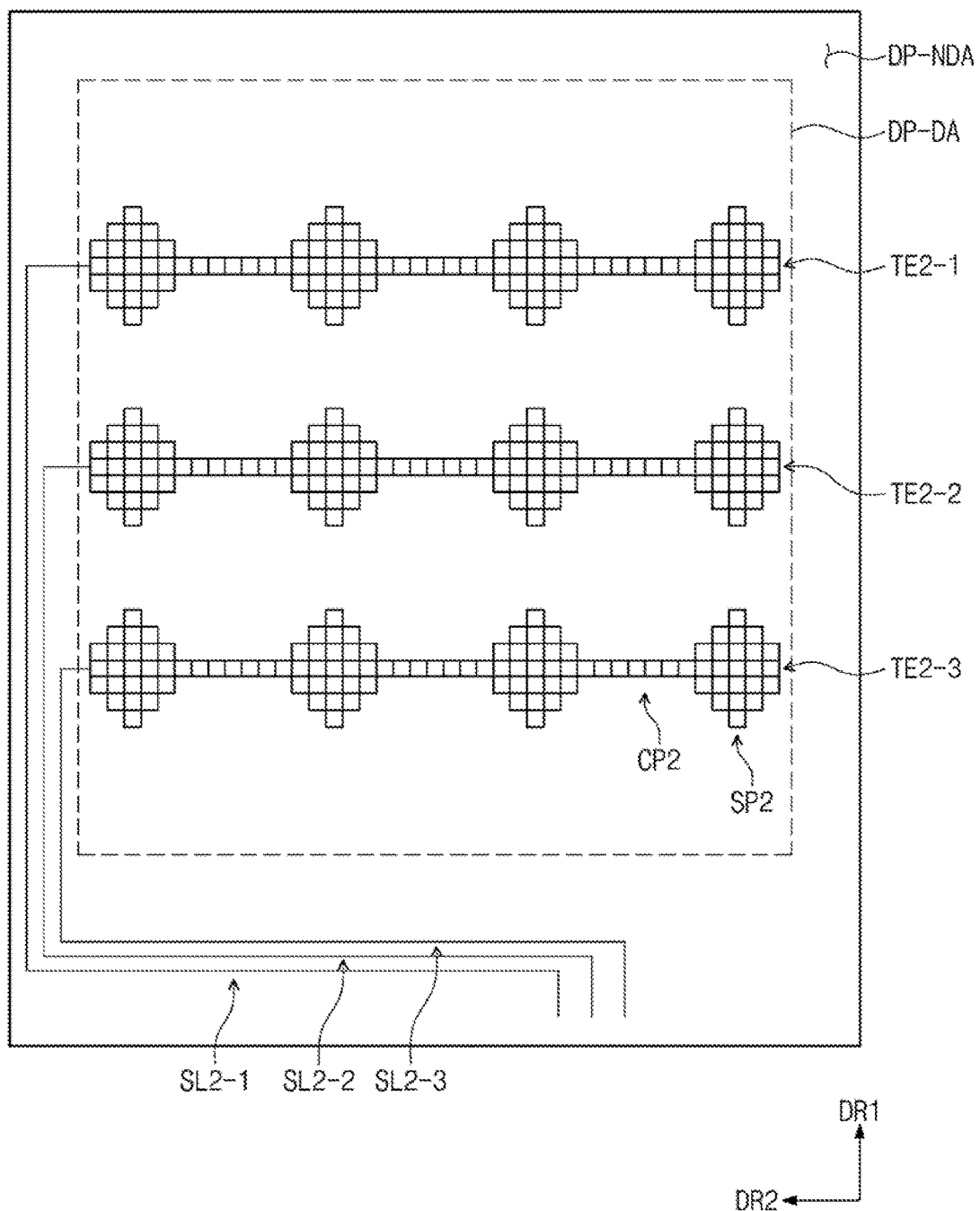

FIG. 12A is a cross-sectional view of a touch sensing layer TS according to an exemplary embodiment of the present inventive concept. FIGS. 12B and 12C are plan views illustrating the touch sensing layer TS according to an exemplary embodiment of the present inventive concept. A 2-layer type touch sensing layer TS is directly disposed on the encapsulation layer TFE.

As illustrated in FIG. 12A, the touch sensing layer TS includes a first conductive layer TS-CL1, a first touch insulation layer TS-IL1, a second conductive layer TS-CL2, and a second touch insulation layer TS-IL2.

Each of the first conductive layer TS-CL1 and the second conductive layer TS-CL2 may have either a single layer structure or a multi-layer structure laminated in the third direction DR3. The conductive layer, having the multi-layer structure, may include a transparent conductive layer and at least one metal layer. The conductive layer having the multi-layer structure may include metal layers each of which includes different metal from each other. The transparent conductive layer may include an indium tin oxide (ITO), an indium zinc oxide (IZO), a zinc oxide (ZnO), an indium tin zinc oxide (ITZO), PEDOT, a metal nanowire, and/or graphene. The metal layer may include molybdenum, silver, titanium, copper, aluminum, and/or an alloy of one or more of these metals.

Each of the first conductive layer TS-CL1 and the second conductive layer TS-CL2 includes a plurality of patterns. Hereinafter, the first conductive layer TS-CL1 includes first conductive patterns, and the second conductive layer TS-CL2 includes second conductive patterns. Each of the first conductive patterns and the second conductive patterns may include touch electrodes and touch signal lines.

Each of the first conductive layer TS-CL1 and the second conductive layer TS-CL2 may include an inorganic or organic material. The inorganic material may include a silicon oxide or a silicon nitride. The organic material may include an acrylic-based resin, a methacryl-based resin, polyisoprene, a vinyl-based resin, an epoxy-based resin, a urethane-based resin, a cellulose-based resin, and/or a perylene-based resin. While the first touch insulation layer TS-IL1 insulates the first conductive layer TS-CL1 and the second conductive layer TS-CL2, the shape thereof is not so limited. The shape of the first touch insulation layer TS-IL1 may be varied according to the shapes of the first conductive patterns and the second conductive patterns. The first touch insulation layer TS-IL1 may entirely cover the thin film encapsulation layer TFE or may include a plurality of insulation patterns.

The 2-layer type capacitive touch sensing layer illustrated in FIGS. 12B and 12C may acquire coordinate information of a position touched by a self capacitance method or a mutual capacitance method. The driving method for acquiring the coordinate information is not limited to any particular approach. The first conductive patterns in FIG. 12B correspond to the first conductive layer TS-CL1 in FIG. 12A, and the second conductive patterns in FIG. 12C correspond to the second conductive layer TS-CL2 in FIG. 12A.

As illustrated in FIG. 12B, the first conductive patterns may include first touch electrodes TE1-1 to TE1-3 and first touch signal lines SL1-1 to SL1-3. FIG. 12B illustrates three first touch electrodes TE1-1 to TE1-3 and first touch signal lines SL1-1 to SL1-3 respectively connected thereto.

The first touch electrodes TE1-1 to TE1-3 extend in the first direction DR1 and are arranged in the second direction DR2. Each of the first touch electrodes TE1-1 to TE1-3 has a mesh shape in which a plurality of touch openings is defined.

Each of the first touch electrodes TE1-1 to TE1-3 includes a plurality of first sensor parts SP1 and a plurality of first connecting parts CP1. The first sensor parts SP1 are arranged in the first direction DR1. Each of the first connecting parts CP1 connect two first sensor parts SP1 disposed adjacent to each other among the first sensor parts SP1.

The first touch signal lines SL1-1 to SL1-3 may also have the mesh shape. The first touch signal lines SL1-1 to SL1 may have the same layer structure as that of the first touch electrodes TE1-1 to TE1-3.

As illustrated in FIG. 12C, the second conductive patterns may include second touch electrodes TE2-1 to TE2-3 and second touch signal lines SL2-1 to SL2-3. FIG. 12C illustrates three second touch electrodes TE2-1 to TE2-3 and second touch signal lines SL2-1 to SL2-3 respectively connected thereto.

The second touch electrodes TE2-1 to TE2-3 cross the first touch electrodes TE1-1 to TE1-3 but are electrically insulated from each other. Each of the second touch electrodes TE2-1 to TE2-3 has a mesh shape in which a plurality of touch openings is defined.

Each of the second touch electrodes TE2-1 to TE2-3 includes a plurality of second sensor parts SP2 and a plurality of second connecting parts CP2. The second sensor parts SP2 are arranged in the second direction DR2. Each of the second connecting parts CP1 connects two second sensor parts SP2 disposed adjacent to each other from among the second sensor parts SP2.

The second touch signal lines SL2-1 to SL2-3 may also have the mesh shape. The second touch signal lines SL2-1 to SL2-3 may have the same layer structure as that of the second touch electrodes TE2-1 to TE2-3.

The first touch electrodes TE1-1 to TE1-3 and the second touch electrodes TE2-1 to TE2-3 may together form a capacitor. As touch sensing signals are applied to the first touch electrodes TE1-1 to TE1-3, capacitors are formed between the first sensor parts SP1 and the second sensor parts SP2.

The shapes of the first touch electrodes TE1-1 to TE1-3 and the second touch electrodes TE2-1 to TE2-3 including the sensor part and the connecting part illustrated in FIGS. 12B and 12C are provided only as examples. The shapes of the first touch electrodes TE1-1 to TE1-3 and the second touch electrodes TE2-1 to TE2-3 are not limited to the arrangement shown. The connecting part is defined as a portion in which the first touch electrodes TE1-1 to TE1-3 cross the second touch electrodes TE2-1 to TE2-3, and the sensor part is defined as a portion in which the first touch electrodes TE1-1 to TE1-3 do not overlap the second touch electrodes TE2-1 to TE2-3. According to an exemplary embodiment of the present inventive concept, each of the first touch electrodes TE1-1 to TE1-3 and the second touch electrodes TE2-1 to TE2-3 may have a bar shape having a constant width.

Figure 13A:
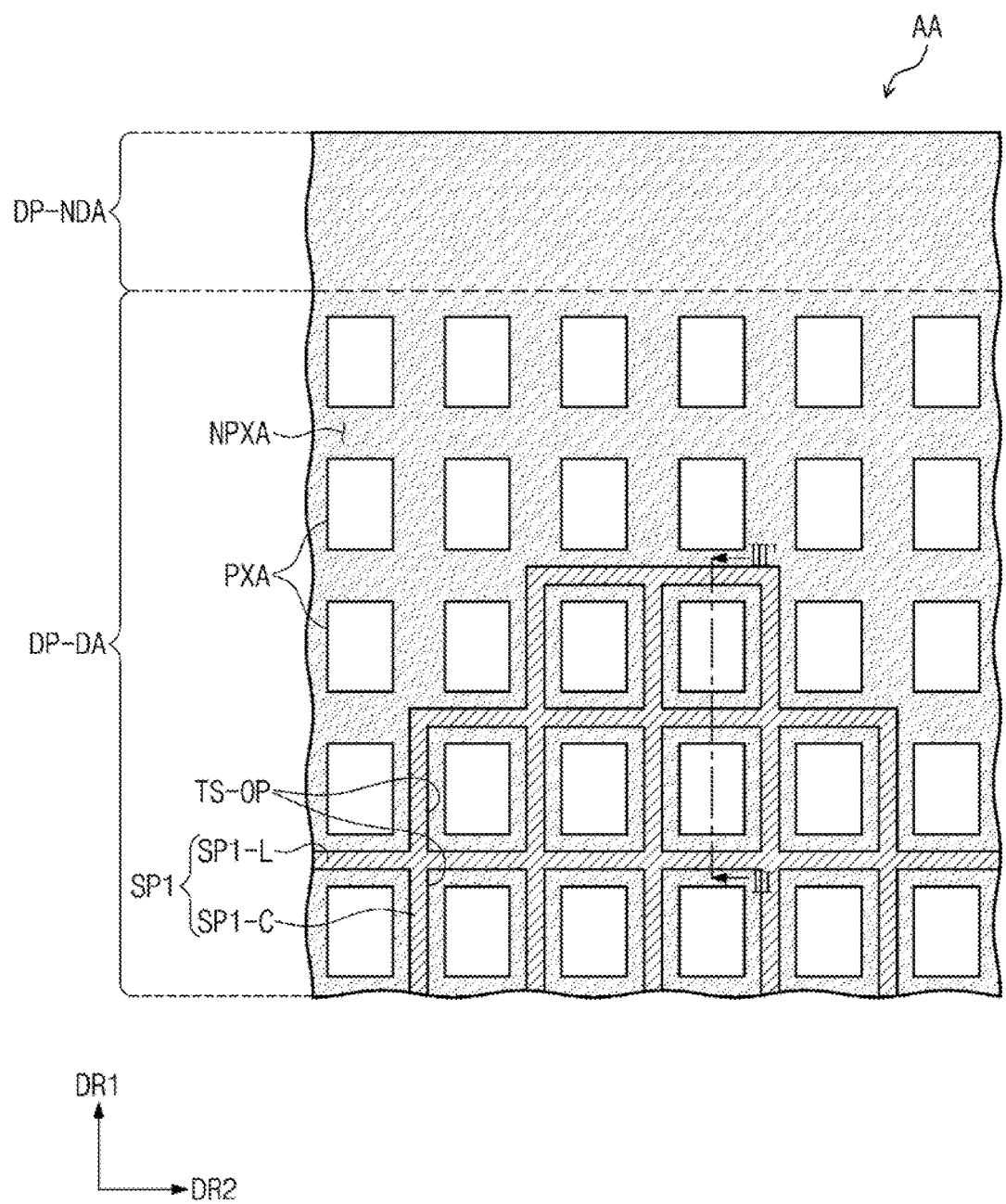
FIG. 13A is a partial plan view illustrating a display module according to an exemplary embodiment of the present inventive concept.
Figure 13B:
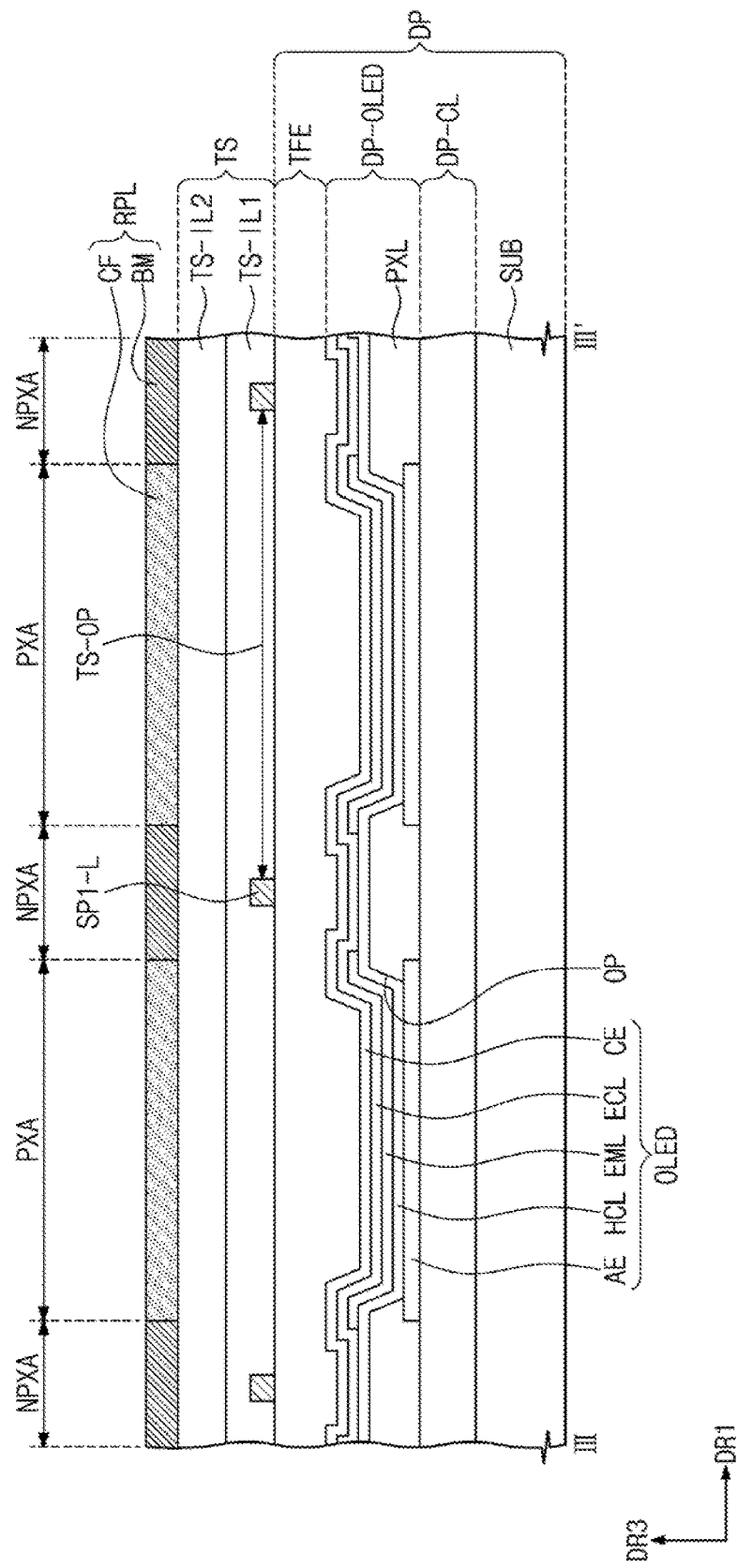
FIG. 13B is a cross-sectional view illustrating a display module according to an exemplary embodiment of the present inventive concept.

FIG. 13A is a partial plan view of the display module DM according to an exemplary embodiment of the present inventive concept. FIG. 13B is a cross-sectional view of the display module DM according to an exemplary embodiment of the present inventive concept. FIG. 13A is an enlargement of an area AA of FIG. 12B. FIG. 13B illustrates a cross-section of the display module DM taken along line III-III' of FIG. 13A.

As illustrated in FIG. 13A, the first sensor part SP1 overlaps the non-light emitting area NPXA. The first sensor part SP1 includes a plurality of first vertical portions SP1-C extending in the first direction and a plurality of horizontal portions SP1-L extending in the second direction DR2. The plurality of first vertical portions SP1-C and the plurality of horizontal portions SP1-L may be defined as a mesh line.

The mesh line may have a line width of several μm, for example, the mesh line width may be in the range of 1 to 5 μm.

The plurality of first vertical portions SP1-C and the plurality of horizontal portions SP1-L are connected to each other to provide a plurality of touch openings TS-OP. For example, the first sensor part SP1 has a mesh shape including the plurality of touch openings TS-OP. Although the touch openings TS-OP are illustrated as having a one-to-one correspondence with the light emitting areas PXA, the present inventive concept is not limited thereto. For example, one touch opening TS-OP may correspond to two or more light emitting areas PXA.

Although not separately shown, each of the first connecting part CP1, the second sensor part SP2, and the second connecting part CP2 may have a shape corresponding to the first sensor part SP1.

As illustrated in FIG. 13B, the first touch insulation layer TS-IL1 overlaps the display area DP-DA and the non-display area DP-NDA and is disposed on the thin film encapsulation layer TFE. The first touch insulation layer TS-IL1 covers the first sensor part SP1 (for example, as seen in FIG. 13A) e.g., the first horizontal portion SP1-L. The first touch insulation layer TS-IL1 may also cover the first connecting part CP1 and the first touch signal lines SL1-1 to SL1-3.

The second touch insulation layer TS-IL2 is disposed on the first touch insulation layer TS-IL1 and overlaps the display area DP-DA and the non-display area DP-NDA. The second touch insulation layer TS-IL2 may cover the second sensor part SP2 (which may be seen in FIG. 12C) and the second connecting part CP2 (which may be seen in FIG. 12C).

The reflection preventing layer RPL is disposed on the second touch insulation layer TS-IL2. The reflection preventing layer RPL may include color filters CF overlapping the light emitting areas PXA-R, PXA-G, and PXA-B and a black matrix BM overlapping the non-light emitting area NPXA.

As described above, since the top cover having the same color as that of the bottom cover covers almost the whole of the bezel layer, the bezel layer might not require the use of the colored layer having the same color as that of the bottom cover. As the colored layer is omitted, the cost for manufacturing the display module is reduced. Since the top cover covers almost the whole of the bezel layer, any evidence of poor printing of the bezel layer is not visible. Accordingly, the bezel layer may be printed thinly or in a single layer.

The stepped portion of the display window member increases the coupling area of the top cover. Thus, the top cover may be firmly coupled to the display window member or the bottom cover.

It will be apparent to those skilled in the art that various modifications and variations can be made in the present invention. Thus, it is intended that the present invention covers the modifications and variations of this invention.

What is claimed is:
1. An electronic device comprising:
a display module; and
a top cover disposed above the display module and overlapping at least a portion of the display module,
wherein the display module comprises:
a display panel; and
a display window comprising a central portion disposed above the display panel and an edge portion adjacent to the central portion, wherein the edge portion overlaps the top cover and is thinner than the central portion.

2. The electronic device of claim 1, further comprising a bottom cover disposed below the display module.

3. The electronic device of claim 2, wherein the top cover is coupled to the display module or the bottom cover.

4. The electronic device of claim 1, wherein the bottom cover and the top cover have the substantially same color each other.

5. The electronic device of claim 1, wherein the display module further comprises a bezel disposed on a bottom surface of the display window and overlapping the edge portion.

6. The electronic device of claim 5, wherein the bezel comprises at least one achromatic layer.

7. The electronic device of claim 5, wherein a portion of the bezel is exposed by the top cover.

8. The electronic device of claim 1, wherein the top cover comprises at least one light transmitting portion and a light shielding portion surrounding the at least one light transmitting portion, and
wherein the at least one light transmitting portion does not partially or fully overlap the display module.

9. The electronic device of claim 5, wherein the central portion comprises a central bottom surface occupying a plane defined by a first direction and a second direction, a central top surface facing the central bottom surface in a direction normal to the central bottom surface, and connecting surfaces connecting the central bottom surface to the central top surface,
wherein the edge portion comprises a first edge portion and a second edge portion, which are connected to a first connecting surface of the connecting surfaces and a second connecting surface of the connecting surfaces, respectively, and
wherein the first connecting surface and the second connecting surface face each other in the first direction.

10. The electronic device of claim 9, wherein the bezel is further disposed on a first edge area of the central bottom surface and a second edge area of the central bottom surface, which face each other in the second direction.

11. The electronic device of claim 9, wherein the connecting surfaces further comprise a third connecting surface and a fourth connecting surface, which face each other in the second direction, and
wherein each of the third connecting surface and the fourth connecting surface is curved.

12. The electronic device of claim 9, wherein the top cover comprises a first top cover covering the first edge portion and a second top cover covering the second edge portion.

13. The electronic device of claim 9, wherein each of the first edge portion and the second edge portion extends predominantly in the second direction.

14. The electronic device of claim 13, wherein the first edge portion is connected to the first connecting surface and comprises an edge top surface facing the central top surface, and
wherein the central top surface, the first connecting surface, and the edge top surface define a stepped portion.

15. The electronic device of claim 14, wherein the first edge portion further comprises an edge bottom surface facing the edge top surface in the direction normal to the central bottom surface, and
wherein the edge bottom surface is disposed on the plane defined by the first and second directions.

16. The electronic device of claim 1, wherein the display window comprises tempered glass.

17. The electronic device of claim 1, wherein the display window comprises:
a base substrate;
a base film having the bottom surface of the display window; and
an adhesion layer coupling the base film to the base substrate.

18. The electronic device of claim 1, wherein the display module further comprises:
a protective film disposed below the display panel; and
a support member disposed below the protective film.

19. The electronic device of claim 18, wherein the support member comprises a plastic substrate.

20. The electronic device of claim 18, wherein the display module further comprises:
a touch sensor disposed above the display panel; and
a reflection preventing layer disposed above the display panel.

21. An electronic device comprising:
a display module; and
a top cover disposed above the display module and overlapping at least a portion of the display module,
wherein the display module comprises:
a display panel;
a display window comprising a central portion disposed above the display panel and an edge portion adjacent to the central portion, wherein the edge portion overlaps the top cover and is thinner than the central portion; and
a functional layer disposed on the central portion of the display window and exposing the edge portion.

22. An electronic device, comprising:
a housing;
a display panel disposed below the housing; and
a display window disposed between the display panel and the housing, the display window including an inner portion and an outer portion framing the inner portion,
wherein the housing overlaps the outer portion of the display window, and
wherein a thickness of the inner portion of the display window is substantially equal to a thickness of the outer portion of the display window plus the thickness of a portion of the housing that overlaps the outer portion of the display window.

* * * * *